US009504187B2

(12) United States Patent
Hagiwara et al.

(10) Patent No.: US 9,504,187 B2
(45) Date of Patent: Nov. 22, 2016

(54) ELECTRONIC DEVICE HOUSING AND ELECTRONIC DEVICE

(71) Applicant: FUJITSU LIMITED, Kawasaki-shi, Kanagawa (JP)

(72) Inventors: Yuichi Hagiwara, Miyasiro (JP); Takao Tomiyama, Gyouda (JP); Manabu Miyamoto, Koga (JP); Hiroshi Yano, Kawaguchi (JP); Kenichi Oide, Fukaya (JP); Yoshihiro Ito, Kawasaki (JP); Takanori Iwamatsu, Nasushiobara (JP)

(73) Assignee: Fujitsu Limited, Kawasaki (JP)

( * ) Notice: Subject to any disclaimer, the term of this patent is extended or adjusted under 35 U.S.C. 154(b) by 1 day.

(21) Appl. No.: 14/639,011

(22) Filed: Mar. 4, 2015

(65) Prior Publication Data

US 2015/0271950 A1 Sep. 24, 2015

(30) Foreign Application Priority Data

Mar. 20, 2014 (JP) ................................ 2014-057633

(51) Int. Cl.
*H05K 7/20* (2006.01)
*H01L 23/473* (2006.01)

(52) U.S. Cl.
CPC .................................... *H05K 7/206* (2013.01)

(58) Field of Classification Search
CPC .............................. G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ....................... 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/213
See application file for complete search history.

(56) References Cited

U.S. PATENT DOCUMENTS 6,039,111 A * 3/2000 Kawaguchi ......... F28D 15/0266 165/104.14
2004/0114323 A1* 6/2004 Mok ......................... G06F 1/16 361/679.49

(Continued)

FOREIGN PATENT DOCUMENTS

JP 2000-101271 A 4/2000
JP 2003-218572 A 7/2003

*Primary Examiner* — Anthony Haughton
*Assistant Examiner* — Razmeen Gafur
(74) *Attorney, Agent, or Firm* — Arent Fox LLP

(57) ABSTRACT

An electronic device housing, includes: a housing case including a housing area which houses a heat generating component; a duct, including ends which are in communication with the housing area at different positions respectively and a body portion disposed outside the housing area, in which first air inside housing case which is heated by the heat generating component flows; and a flow device, disposed in the housing case, configured to circulate the first air and make second air which radiates heat in the duct flow towards a side of the housing area side.

17 Claims, 27 Drawing Sheets

(56) References Cited

U.S. PATENT DOCUMENTS

2004/0145868 A1* 7/2004 Nair ...................... H01L 23/467 361/694
2005/0264995 A1* 12/2005 Hanson ..................... G06F 1/20 361/695
2006/0087810 A1* 4/2006 Rockenfeller ............ G06F 1/20 361/679.47
2006/0087812 A1* 4/2006 Meyer ................... H01F 27/025 361/688
2006/0215363 A1* 9/2006 Shipley .............. H05K 7/20563 361/695
2007/0035925 A1* 2/2007 Kobayashi ................ G06F 1/20 361/688
2007/0171610 A1* 7/2007 Lewis ................ H05K 7/20745 361/691
2008/0055850 A1* 3/2008 Carlson ..................... G06F 1/20 361/695
2008/0106864 A1* 5/2008 Merino ................... G06F 1/181 361/688
2008/0158815 A1* 7/2008 Campbell .......... H05K 7/20754 361/696
2009/0034171 A1* 2/2009 Hayashi .................... G06F 1/20 361/679.49
2009/0034309 A1* 2/2009 Ibori ..................... H02M 7/003 363/141
2009/0141247 A1* 6/2009 Oh ......................... G03B 21/16 353/61
2009/0161311 A1* 6/2009 Tseng ........................ G06F 1/20 361/679.47
2009/0262497 A1* 10/2009 Beauchamp .............. G06F 1/20 361/679.49
2009/0310301 A1* 12/2009 Nelson ............... H05K 7/20163 361/695
2010/0277864 A1* 11/2010 Tozer ................ H05K 7/20827 361/679.47
2012/0050991 A1* 3/2012 Tamanuki ............. H01L 23/467 361/697
2012/0181003 A1* 7/2012 Zurowski ........... H05K 7/20154 165/121
2012/0250255 A1* 10/2012 Shigeno ............. H05K 7/20918 361/692
2013/0120934 A1* 5/2013 Barna ................ H05K 7/20145 361/689
2013/0141867 A1* 6/2013 Zhou .................. H05K 7/20909 361/691
2013/0319638 A1* 12/2013 Degner ..................... G06F 1/20 165/104.21

* cited by examiner

ELECTRONIC DEVICE HOUSING AND ELECTRONIC DEVICE

CROSS-REFERENCE TO RELATED APPLICATION

This application is based upon and claims the benefit of priority of the prior Japanese Patent Application No. 2014-057633, filed on Mar. 20, 2014, the entire contents of which are incorporated herein by reference.

FIELD

The embodiments discussed herein are related to an electronic device housing and an electronic device.

BACKGROUND

In an electronic device, sealability of a housing is called for in order for an electronic component housed inside the housing to operate in a stable manner without being affected by the installed environment and the like. Since an electronic component employed in an electronic device is a standard product regardless of the installed environment of the electronic device, the protective function on the housing side is important. In order to reduce entering foreign matters, corrosive gas, and salt into the housing, the housing is formed of a watertight structure, and the housing employs measures such as sealing the gap in the housing with a packing and the like.

Related techniques are disclosed in Japanese Laid-open Patent Publication No. 2003-218572 and Japanese Laid-open Patent Publication No. 2000-101271.

SUMMARY

According to an aspect of the embodiments, an electronic device housing, includes: a housing case including a housing area which houses a heat generating component; a duct, including ends which are in communication with the housing area at different positions respectively and a body portion disposed outside the housing area, in which first air inside housing case which is heated by the heat generating component flows; and a flow device, disposed in the housing case, configured to circulate the first air and make second air which radiates heat in the duct flow towards a side of the housing area side.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In an electronic device provided with a closed housing, such as a waterproof structure, discharge of heat of heat generating components housed therein such as electronic components, is performed efficiently. In a closed housing, since air cooling that cools the heat generating components by taking in external air is not performed, the temperature inside the housing is lowered, for example, using transfer of heat through the housing made of metal. In such a case, a method is adopted in which heat from the heat generating components is taken away by having air flow inside the housing and in which a heat radiation efficiency outside of the housing is increased.

In a closed case, for example, air inside the case may be cooled by forming a heat exchanger in a portion of the housing, sending the warmed air to the heat exchanger by having the air flow inside the housing and exchanging heat with the external air taken in from the outside. For example, heat exchange is performed between the external air, which has been taken in into a metal duct passed through an inside of a closed space formed by housing plates, and the air inside the housing.

In an electronic device installed outdoors, in order to enable replacement of heat generating electronic components that is housed inside a housing, a shelf structure, in which the top and bottom or the left and right sides of a plurality of the same or different components are fixed with rails or the like, is adopted. In such electronic devices, in order to simplify the forming process, fins are formed as a cooling member in the inside and the outside of the housing. Heat exchange between the air flowing inside the housing and the external air flowing outside the housing is performed through the fins such that heat is radiated.

Figure 1:
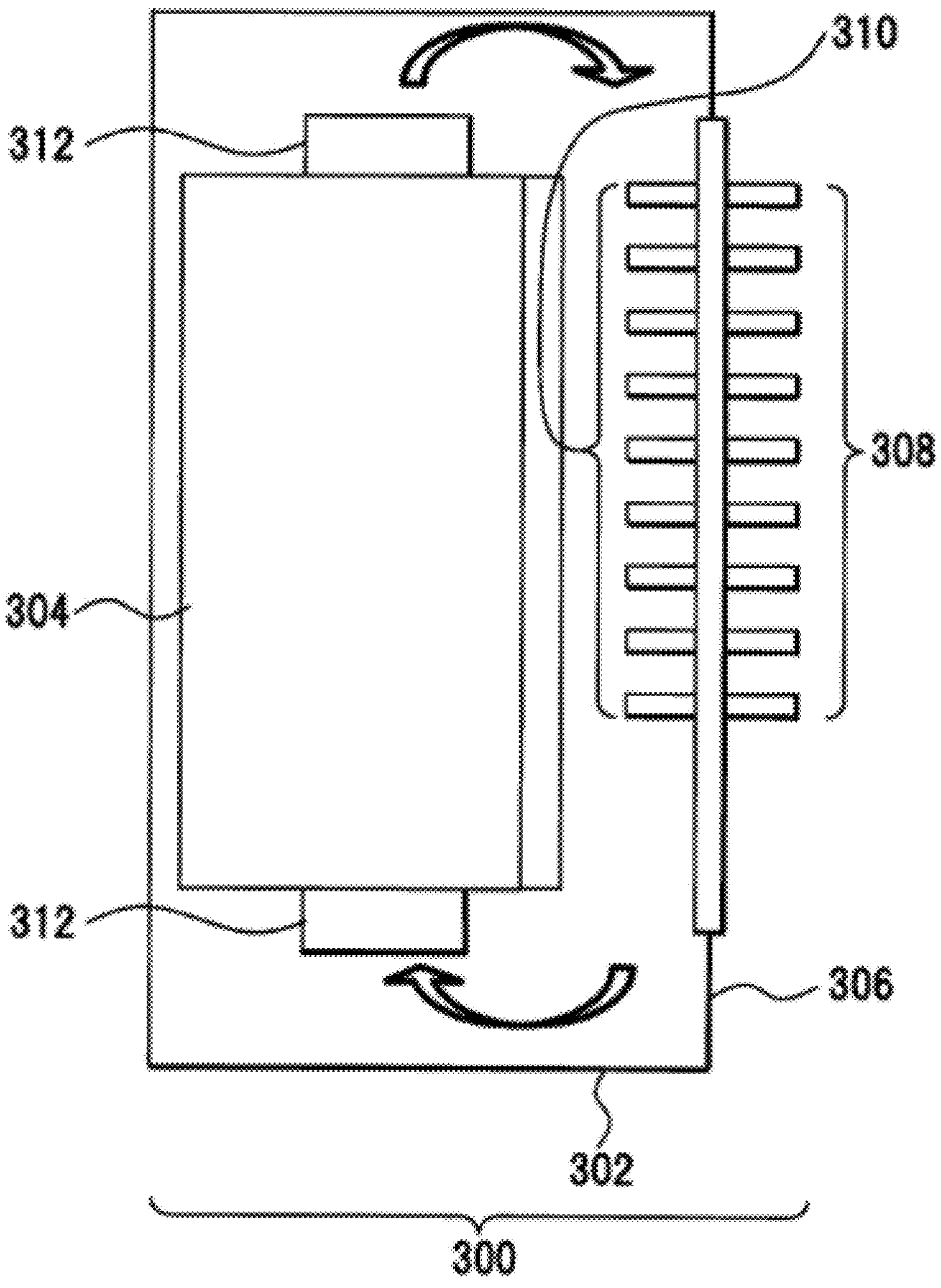
FIG. 1 illustrates an example of a cooling structure of an electronic device.

FIG. 1 illustrates an example of a cooling structure of an electronic device. In an electronic device 300 including fins 308 and 310 illustrated in FIG. 1, an electronic component 304 is housed inside a housing 302 with a shelf structure, for example. On a rear side of the electronic device 300, the fins 308 and 310 are formed on a front side and a rear side of a fin cover 306. Fans 312 that are installed on an upper side and an underside of the electronic component 304 inside the housing 302 make the air flow in a certain direction inside the housing 302.

In order to enhance the cooling function, areas of the fins 310 in contact with the air inside the housing 302 are formed large. For example, with an increase in the size or number of the fins 310, when the flow of air inside the housing 302 is impeded, air having a high temperature may stagnate inside a portion of the housing 302 and the cooling efficiency may be decreased. In order to facilitate an attachment and detachment operation of the electronic component 304, the fins may not be in contact with the components other than the shelf structure. Accordingly, there may be a limit in increasing the installed number of fins 310 or the size of the fins 310 while avoiding contact with the electric component 304 in the limited space inside the housing.

By increasing the size or the installed number of the fins 310, the load on the housing of the electronic device 300 may increase. Furthermore, in order to reduce contact between the fins 310 and the electric component 304, the housing 302 may become large. Accordingly, the ease of handling during installation and transportation may be reduced. In order to set the temperature to a temperature that enables stable operation of the electronic device 300, the ratio of the weight of the fins 310 with respect to the whole weight may reach about 40%. Such reduction in the ease of handling may lead to increase in the fixing strength of the installation base or the pole to which the electronic device 300 is installed.

Figure 2:
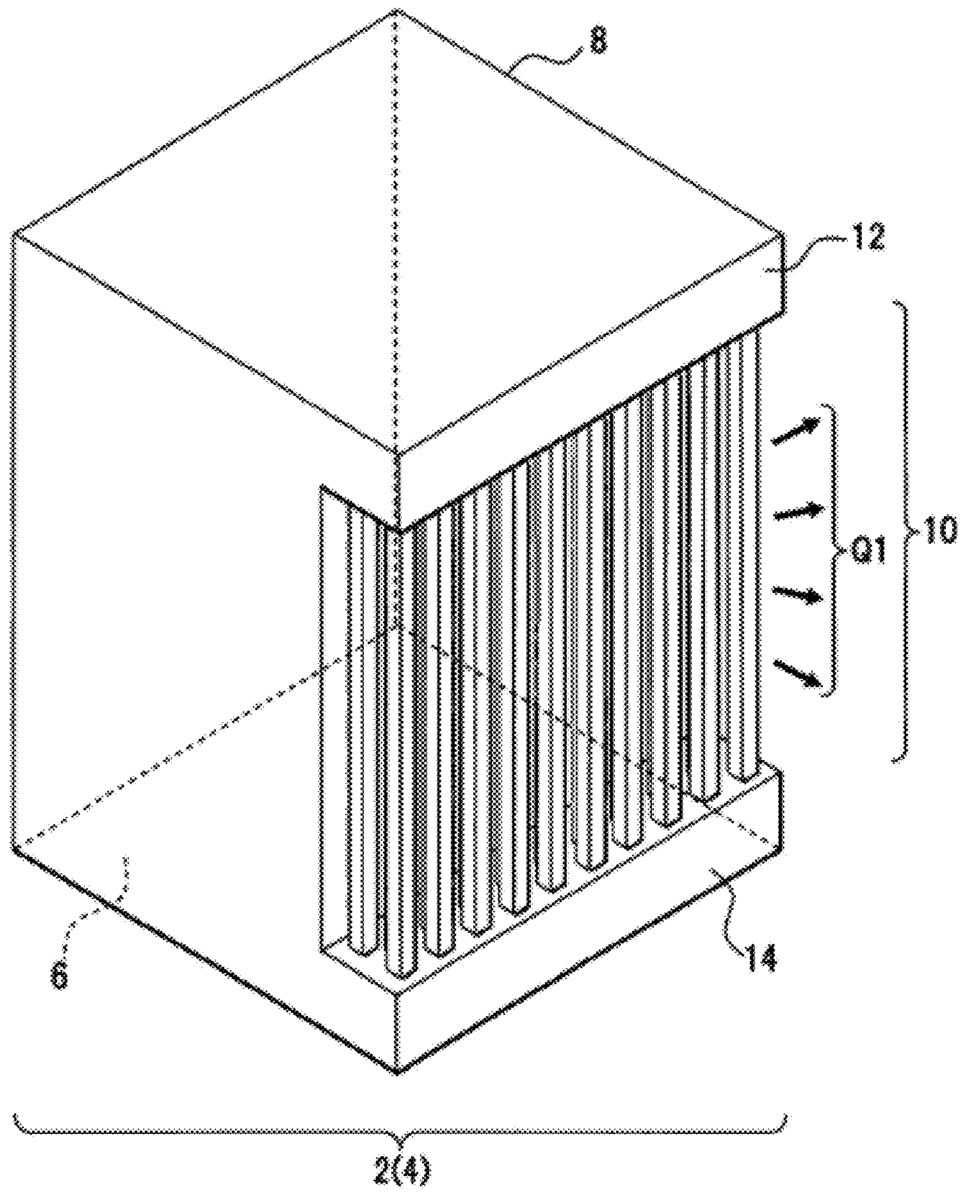
FIG. 2 illustrates an example of a housing of an electronic device.
Figure 3:
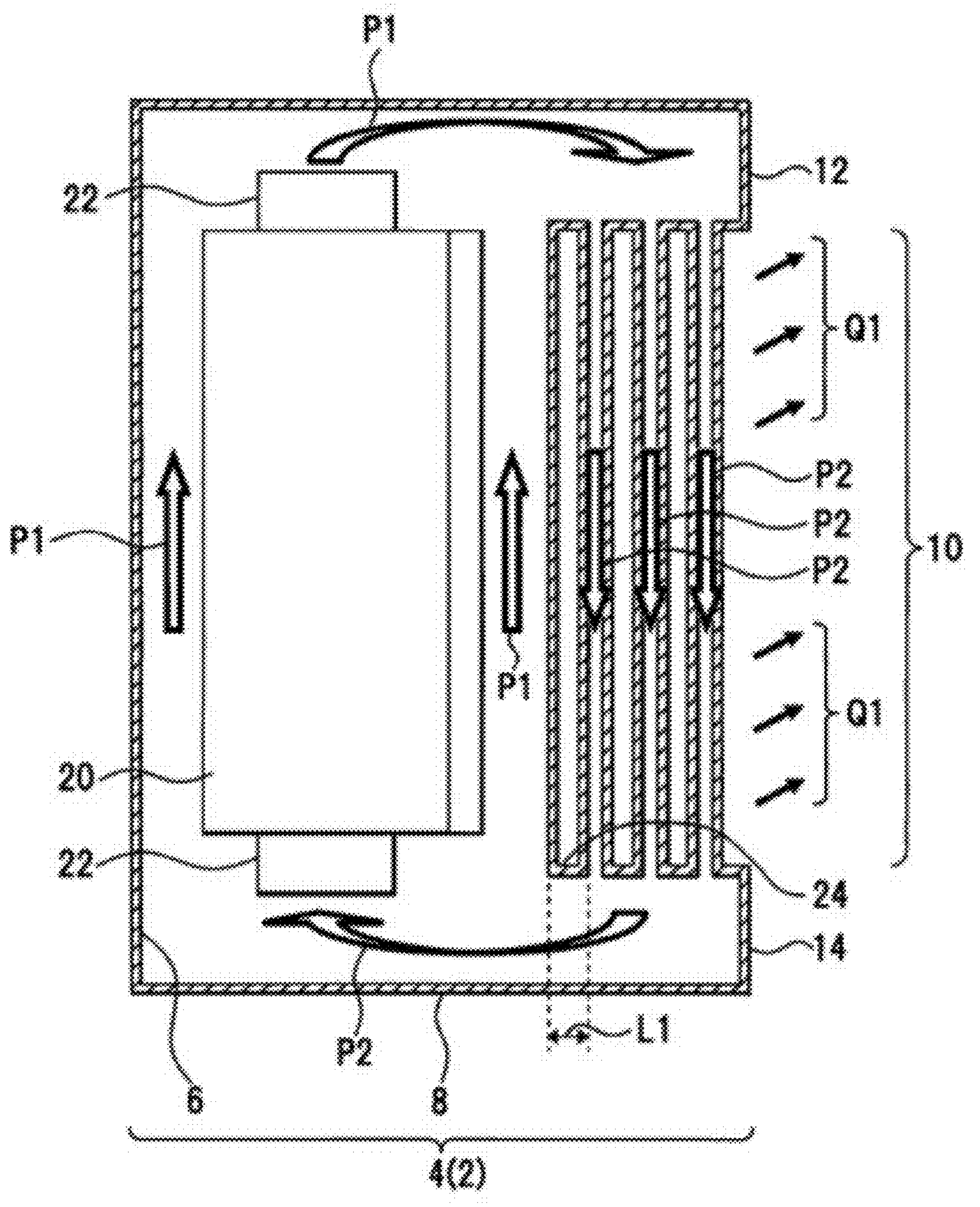
FIG. 3 illustrates an example of an electronic device.

FIG. 2 illustrates an example of a housing of an electronic device. FIG. 3 illustrates an example of an electronic device. A housing 2 of the electronic device may be an example of the electronic device housing.

The housing 2 of the electronic device houses, for example, electronic components including an electronic device 4, fixes and holds the electric components, and blocks physical contact from the outside. A main body portion 8, inside of which a housing portion 6 that houses the electronic components is formed, and ducts 10 provided on an exterior side of the main body portion 8 are formed in the housing 2. The main body portion 8 may be an example of a housing case of the present disclosure and the size and the shape of the housing portion 6 corresponding to a housing area is set in accordance with the size of the electric component housed inside and the outer shape of the housed electronic component. The main body portion 8 is formed having a closed structure so as to be airtight with respect to the outside. The main body portion 8 may be formed of, for example, aluminum or carbon so as to be light weighted and maintain a specific strength, and may be formed of a metal material that has high thermal conductivity.

Two ends of each duct 10 are in communication with the housing portion 6 at different positions and air flow paths through which air inside the housing portion 6 flow are formed in hollow portions inside the ducts 10. In the housing 2, a plurality of ducts 10 each formed with a predetermined width and in a linear manner are installed along one side of the main body portion 8, for example. The ducts 10 are disposed at certain intervals. The ducts 10 may be formed of the same material as that of the main body portion 8, for example. The ducts 10 may be formed as independent components or may be formed integrally with the main body portion 8.

The cross-sectional shape of each duct 10 may be polygonal such as a hollow square shape or may be formed in a round shape. A body portion of each duct 10 is formed with a certain width similar to that of the end portion sides.

In the main body portion 8, connection portions 12 and 14 that are, for example, portions on the rear side protruded in accordance with the layout area of the ducts 10 are formed. The two ends of each duct 10 are coupled to the connection portions 12 and 14 while maintaining a sealed state.

In the electronic device 4, as illustrated in FIG. 3, for example, an electronic component 20 and fans 22 are housed inside the housing portion 6 of the housing 2. In the housing 2, the housing portion 6 and the ducts 10 are in communication with each other through the connection portions 12 and 14. With the rotation of the fans 22, circulation paths through which internal air is made to flow in one direction between the housing portion 6 of the main body portion 8 and the ducts 10 are formed. In the housing 2, for example, when low-temperature air P2 inside the housing portion 6 is made to flow with the rotation of the fans 22, the low-temperature air P2 absorbs heat from the electronic component 20, turns into heated air P1 and flows towards the connection portion 12 side. When the air P1 flows into the ducts 10 from the connection portion 12, the air P1 flowing through the body portions of the ducts 10 radiate heat and are cooled by exchanging heat with external air and turns into the low-temperature air P2. In the ducts 10, a quantity of heat Q1 is radiated to the outside due to the temperature difference between the heated air P1 flowing inside the ducts 10 and the external air with a low temperature.

The cooled air P2 flows into the housing portion 6 through the connection portion 14. In the electronic device 4, the heat generating electronic component 20 is cooled using a repeat of the heat absorption and the heat radiation of the air that circulates through the housing portion 6 and the ducts 10.

The electronic component 20 may be an example of the heat generating component. The electronic component 20 generates heat when the electronic device 4 is driven. The electronic component 20 may be, for example, a component including a computer that functions the electronic device 4 and may include a single or a plurality of components. The electronic component 20 may include, for example, a substrate or the like on which components that generate heat, such as an integrated circuit (IC) that performs arithmetic processing and communication processing and a resister, are mounted. The electric component 20 may be fixed to and supported by the main body portion 8 with a shelf structure including rail components and the like so as to be capable of being replaced by another electronic component in accordance with the function to be operated by the electronic device 4 and the operation capacity.

The fans 22 may be an example of a flow device. The fans 22 are installed inside the housing portion 6 and circulate the air between the housing portion 6 and the ducts 10 in a certain direction. Accordingly, the fans 22 guide the low-temperature air P2, which has radiated heat in the ducts 10 side, into the housing portion 6. A fan 22 may be disposed on at least either one or both of, in the air flowing direction, the upstream side and the downstream side of where the electric component 20 is housed. The fans 22 may be installed on the exterior side of the electronic component 20 or may be configured so as to be fixed to the housing 2.

The rotation speed of the fans 22 are controlled in order to control the circulation amount of air based on the preset temperature of the electronic component 20 and the volume of the housing portion 6, for example. The rotation speed of the fans 22 may be controlled based on the air temperature inside the housing portion 6, for example.

One of the ducts 10 is installed such that a space 24 having a certain interval L1 is provided between the rear plate of the main body portion 8, for example. The space 24 may be an example of a ventilation path. The space 24 passes external air therethrough such that the heat radiation capacity of the duct 10 installed on the rear plate side is maintained. For example, by providing the space 24, transfer of heat from the electronic component 20 inside the housing portion 6 to some of the ducts 10 through the rear plate may be reduced and variation in the cooling capacities of the ducts 10 may be reduced.

In the housing 2, a plurality of ducts 10 having a certain width may be arranged or a single duct 10 having a similar cross-sectional area to or the same cross-sectional area as that of the plurality of ducts 10 may be installed. The connection portions 12 and 14 that couple the ducts 10 may be formed in portions of the main body portion 8. The ducts 10 may be directly fitted to the side wall portion of the main body portion 8.

Since the air heated by the heat generating component circulates without stagnating inside the housing portion 6, the cooling function may improve. By being provided with the ducts 10 through which heated air P1 is made to flow, the housing 2 may be reduced in size and weight without providing a space for circulating air inside the housing portion 6 and the ease of handling of the electronic device housing may be improved. By being provided with spaces 24 between the main body portion 8 and the ducts 10, the duct 10 radiates heat without being affected by the heat from the electronic component 20 inside the housing portion 6. Accordingly, the cooling capacity may be increased.

Figure 4:
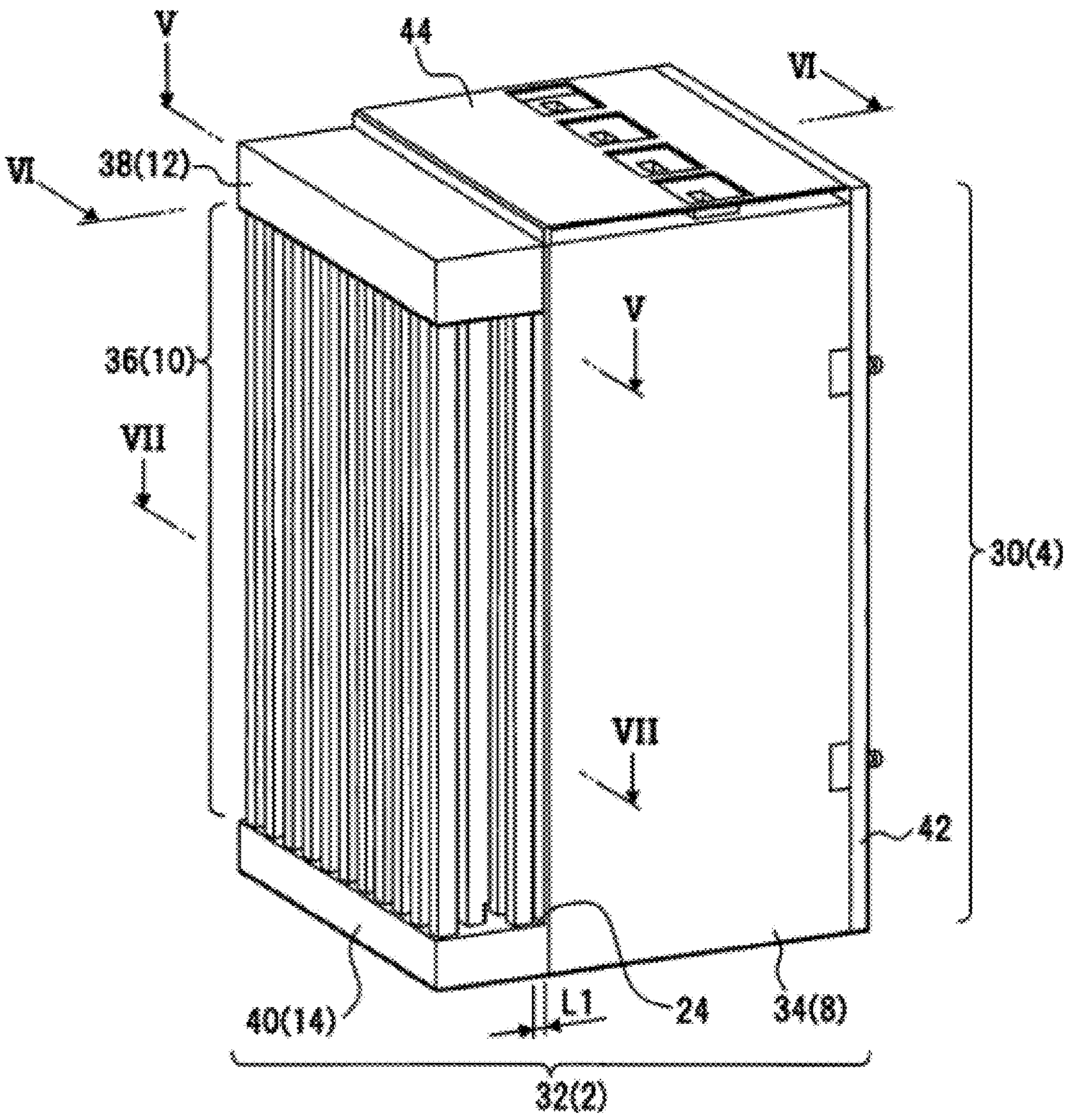
FIG. 4 illustrates an example of an electronic device.

FIG. 4 illustrates an example of an electronic device.

A wireless installation 30 illustrated in FIG. 4 may be an example of the electronic device. A device case 32 includes a main body portion 34 that houses therein a functional component for radio communication and ducts 36 serving as a heat radiation component on the rear side of the main body portion 34. The wireless installation 30 functions as a base station that relays radio communication of personal computers (PCs), portable telephones, information processing equipment or the like. The wireless installation 30 may be, in an outdoor place, fixed to an installation base or a pole (a shaft), or a wall surface of a building, or may be installed inside a dedicated building. Since the environment surrounding the wireless installation 30 differs depending on the installation method and the installation position, by assuming a case in which frequent maintenance is difficult to be performed and considering the maintainability of communication, a device case 32 with enhanced sealability may be used so that troubles such as entering of foreign matters and the like may be reduced.

The end portions of the ducts 36 on the upper and lower sides are coupled to connection portions 38 and 40 obtained by protruding portions of the main body portion 34 such that air is circulated between the ducts 36 and the main body portion 34 to radiate heat. An openable and closable or an attachable and detachable front panel 42 for performing replacement of the functional component housed in the main body portion 34 is installed on the front side of the main body portion 34. Some of the ducts 36 are disposed with a certain interval L1 with respect to the rear side of the main body portion 34. The interval L1 may be set at a distance that does not transmit the heat from the inside of the main body portion 34 to the ducts 36 and that the heat radiated from the ducts 36 does not affect the main body portion 34.

The front panel 42 is installed so as to maintain the sealed state with respect to the main body portion 34 and a sealing structure may be applied thereto, for example. A waveguide portion 44 that transmits a radio communication wave may be installed on the upper portion side of the main body portion 8, for example. The waveguide portion 44 includes a plurality of conduit lines formed of metal and metal plates and is formed so as to be coupled to an external antenna.

<Internal Configuration of the Device Case 32>

Figure 5:
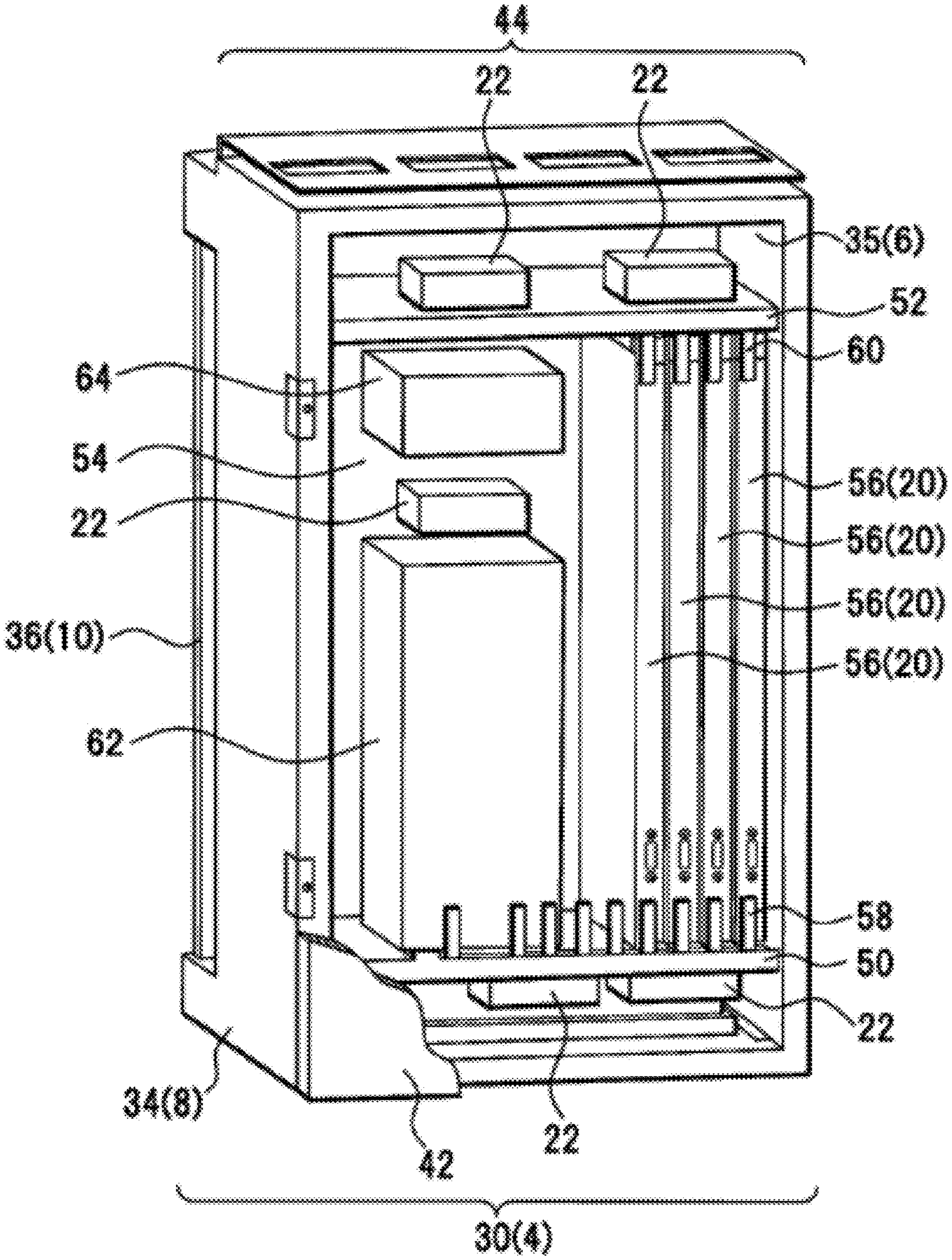
FIG. 5 illustrates an example of an arrangement state inside the electronic device.

FIG. 5 illustrates an example of an arrangement state inside an electronic device. As illustrated in FIG. 5, for example, in the main body portion 34, shelves 50 and 52 for fixing and supporting functional components are provided in a housing portion 35. The shelves 50 and 52 support, for example, the upper and lower portions of the functional components that are housed inside the housing portion 35 and include rail structures and insertion and extraction levers 58 and 60 for enabling attachment and detachment of some or all of the functional components during maintenance. A back wired board (BWB) 54 serving as a control board for mounting a plurality of functional components thereon is housed inside the housing portion 35, and the two ends of the BWB 54 are supported by the shelves 50 and 52. A plurality of radio packages 56 and other mounted components 62 and 64 are mounted on the BWB 54.

Each radio packages 56 may be an example of the heat generating component and may include a substrate on which a radio communication module is mounted. The number of radio packages 56 mounted on the BWB 54 is different depending on, for example, the number of terminals that is coupled to the wireless installation 30, the communication environment, the communication type or the like. A terminal portion that is mounted on the BWB 54 is formed on one side of each radio package 56. Lateral surfaces of each radio package 56 that are surfaces that are different from the surface in which the terminal portion is formed and that are parallel to the upper and lower surfaces of the wireless installation 30 are installed in the rails formed on the shelves 50 and 52. The surface of each radio package 56 on the front side of the housing portion 35 is supported by the corresponding insertion and extraction levers 58 and 60.

The other mounted components 62 and 64 includes, for example, a control circuit that controls the entire wireless installation 30, a filter that distinguishes a specific signal from the transmitted and received radio signal, and other components such as a feeder circuit and the like. The control circuit may be an example of a controller.

Figure 6:
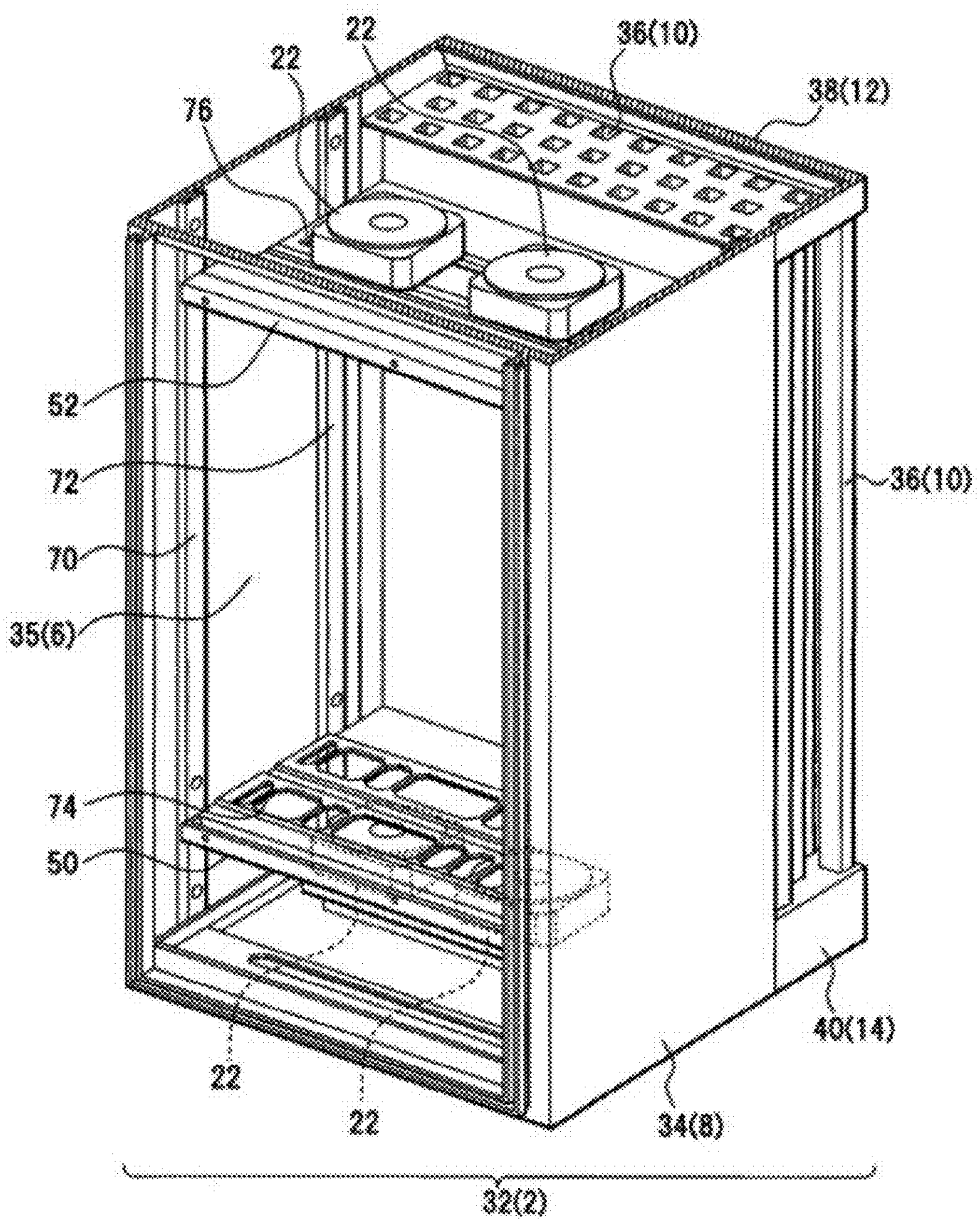
FIG. 6 illustrates an example of an internal configuration of a housing.

FIG. 6 illustrates an example of an internal configuration of a housing. In the shelves 50 and 52, a plurality of fans 22 are installed on the upper portion side or the lower portion side of the housing portion 35 so as to match the positions of the support portions of the BWB 54. As illustrated in FIG. 6, opening portions 74 and 76 are formed in the shelves 50 and 52 so as to match the position where the fans 22 are mounted such that flow of air inside the housing portion 35 that is generated by rotation of the fans 22 is not impeded. The sizes of the opening portions 74 and 76 are set so as not to impede the circulation of air while considering the power consumption of each of the radio packages 56 and so that the temperature of each of the radio packages 56 are within a permissible temperature range. The positions where the fans 22 are disposed may be adjusted in the front and rear direction or in the lateral direction with respect to the shelves 50 and 52.

In the lateral sides inside the main body portion 34, for example, two supports 70 and 72 are formed on the front side and the rear side of the housing portion 35. The supports 70 and 72 are in contact with the lateral sides of the shelves 50 and 52 and support the shelves 50 and 52 at a certain height. The shelf 52 is disposed at a position that is lower than the connection portion of the ducts 36 in the connection portion 38. The shelf 50 is disposed at a position that is higher than the connection portion of the ducts 36 in the connection portion 40. Other than the above, the supports 70 and 72 may support the BMB 54 and other electronic components that are housed inside the housing portion 35.

<State of the Air Flowing inside the Device Case 32>

Figure 7:
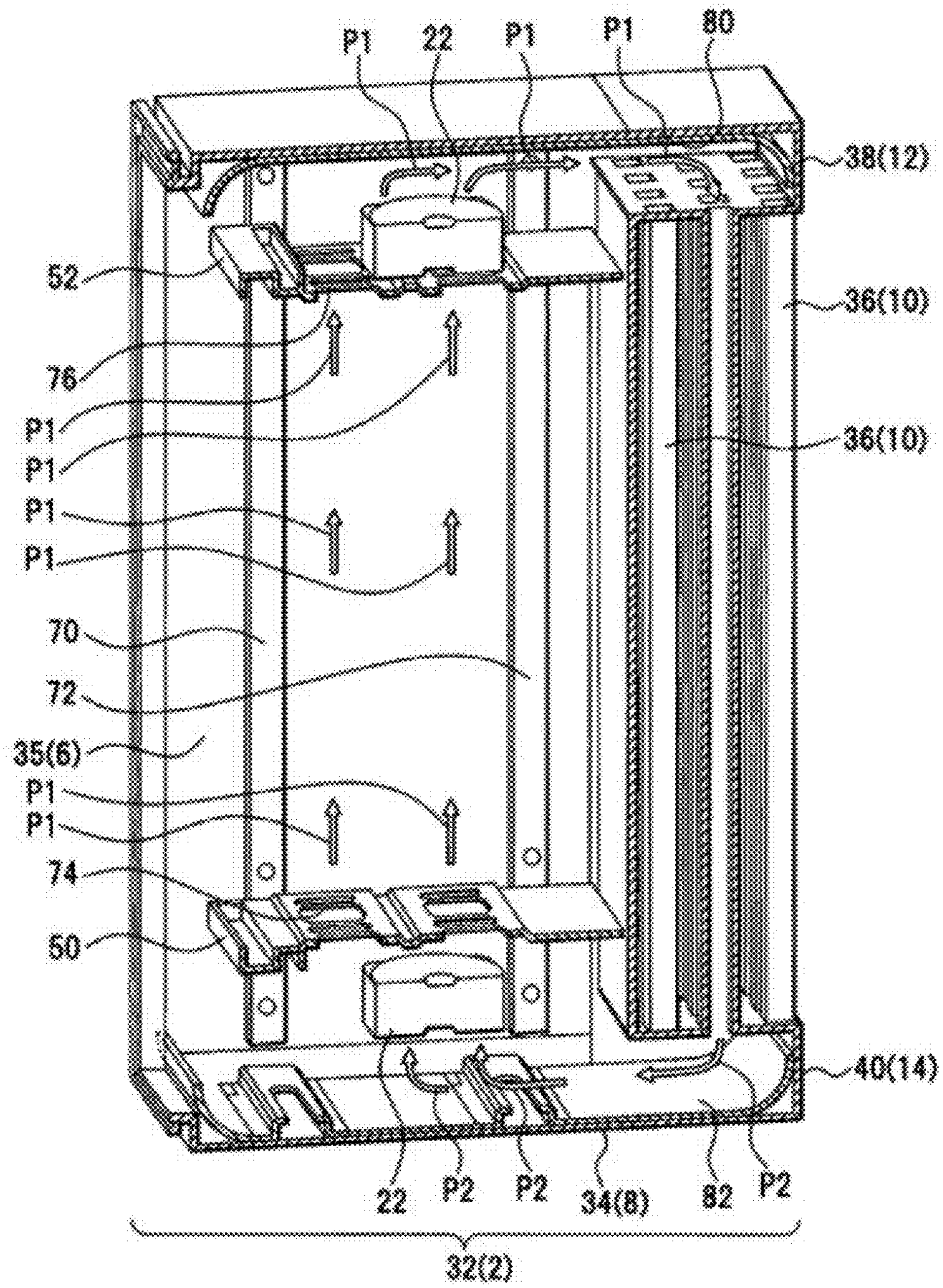
FIG. 7 illustrates an example of an air flowing state inside a housing.

FIG. 7 illustrates an example of an air flowing state inside a housing. As illustrated in FIG. 7, in the housing portion 35, the fans 22 disposed on the upper portion and the lower portion are configured so as to push and pull the air inside the case. Accordingly, the air flows in one direction from the lower portion to the upper portion. The fan 22 on the shelf 52 side sends the air P1 that has been drawn in from the lower portion side towards the connection portion 38 side; accordingly, the air P1 flows into the ducts 36. The fan 22 on the shelf 50 side draws in air P2 from the connection portion 40 side and sends the air P2 towards the housing portion 35 side. Accordingly, in the device case 32, air circulates between the housing portion 35 and the ducts 36.

In order to flow air efficiently between the housing portion 35 and the ducts 36, the shelf 50 may be, for example, disposed at a position higher than the opening portion of the connection portion 40 and the shelf 52 may be disposed at a position lower than the opening portion of the connection portion 38. Regarding the fans 22 that are installed on the shelves 50 and 52 sides, the height of the inflow side or the outflow side may be set so as to coincide with the height of the connection portion between the connection portions 38 and 40 and the ducts 36.

In the device case 32, an air directing plate 80 is formed on the top wall side so as to be formed across the housing portion 35 and the connection portion 38, and an air directing plate 82 is formed on the bottom portion side so as to be formed across the connection portion 40 and the main body portion 34. The air directing plates 80 and 82 may be an example of an air directing member, and may come in contact with the flowing air and make the air flow in a certain direction.

By making the air flow in the above manner, the device case 32 makes the air that has been heated by the radio packages 56, which generate heat by being driven, flow inside the ducts 36. In the ducts 36, the body portion comes into contact with the air outside the case (the external air) and the air inside is cooled by heat transfer. At this moment, the outside air temperature may be lower than the temperature inside the case.

<Ducts 36>

Figure 8:
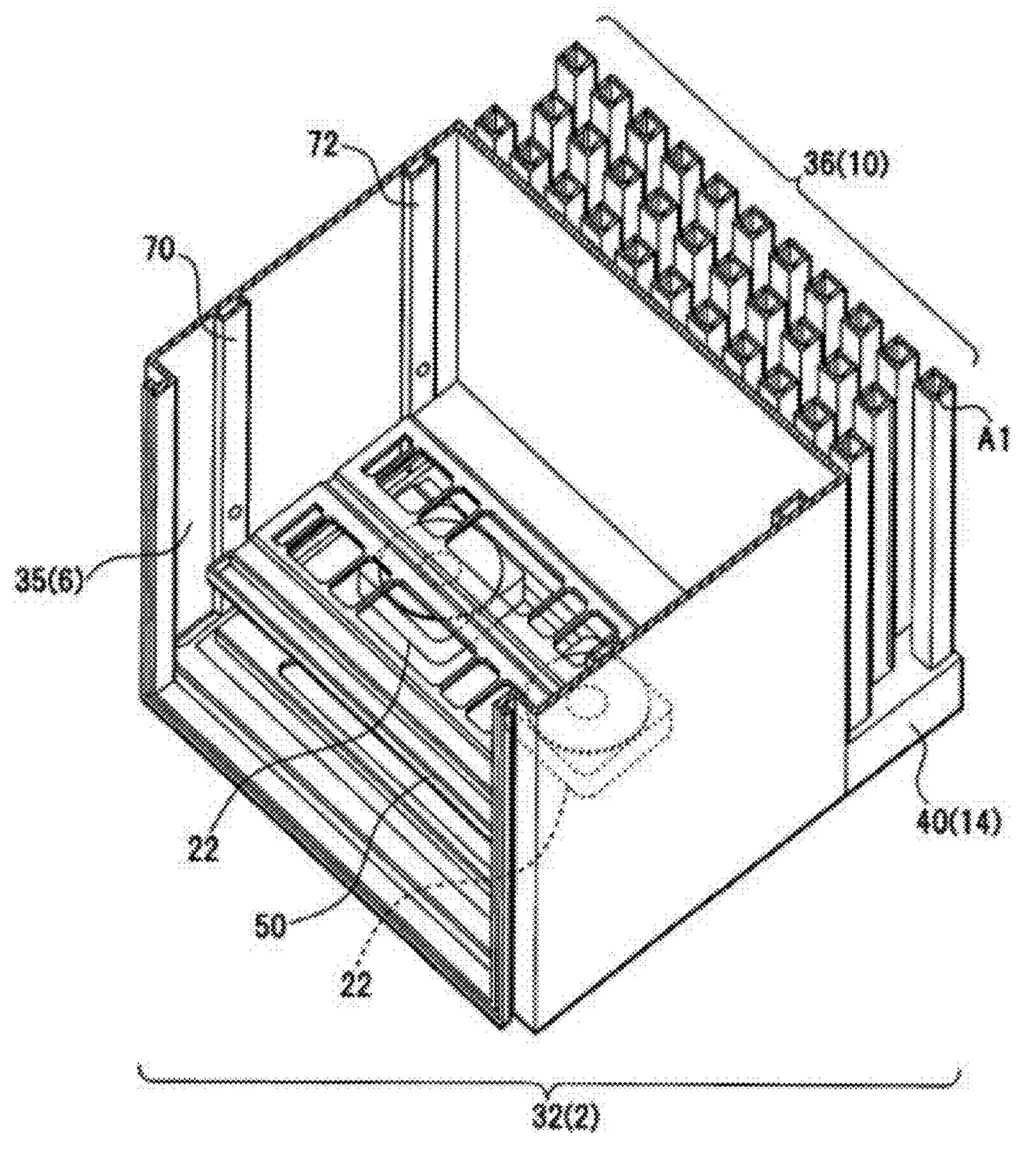
FIG. 8 illustrates an example of an internal shape of a duct.

FIG. 8 illustrates an example of an internal shape of a duct. As illustrated in FIG. 8, for example, the ducts 36 are formed such that a plurality of ducts are arranged at set intervals in lines in the lateral direction while the lines are arranged at certain intervals. An opening area A1 of each duct 36 may be formed so as to be substantially the same. The opening area A1 may be set based on the temperature inside the housing portion 35 and the anticipated temperature of the heat generating component.

The flow velocity of the air that has been taken in into the ducts 36 is determined based on the opening areas A1 with respect to the flow rate of the air made to flow with the fans 22. Since the flow velocity becomes slower as the opening areas A1 become larger, the time in which the air flows inside the ducts 36 becomes longer and the time in which heat is radiated becomes longer. When the opening areas A1 are large, since the volume of air flowing in the entire ducts 36 becomes large, there may be cases in which radiation of heat is not easily carried out when the temperature difference with the external air is small. Accordingly, the opening areas A1 may be set while considering the combination between the flow rate of the fans 22 and the external air temperature condition in the installed environment.

Each duct 36 may be formed so as to have a thin wall in order to increase the heat transfer with the outside air while the air is made to flow. The length of each duct 36 may be formed in accordance with the height of the device case 32. The length of each duct 36 may be set in accordance with the air flowing distance that allows the desired cooling capacity corresponding to the preset temperature of the heat generating component while combining the condition of the opening area Al.

The flow rate control of the fans 22 may be performed by the control circuit and a specific rotation speed may be set in accordance with the number and the type of the radio packages 56 that are installed, for example. The control circuit may control the rotation speed of the fans 22 in accordance with the temperature rise inside the housing portion 35. By controlling the cooling capacity in accordance with the temperature inside the housing portion 35, power consumption may be reduced. Stopping the fans 22 at times of low temperature may start the wireless installation 30 at a low temperature. For example, a temperature sensor may be installed inside the body portion 34 for detecting the temperature inside the housing portion 35.

<Air Directing Plates 80 and 82>

Figure 9:
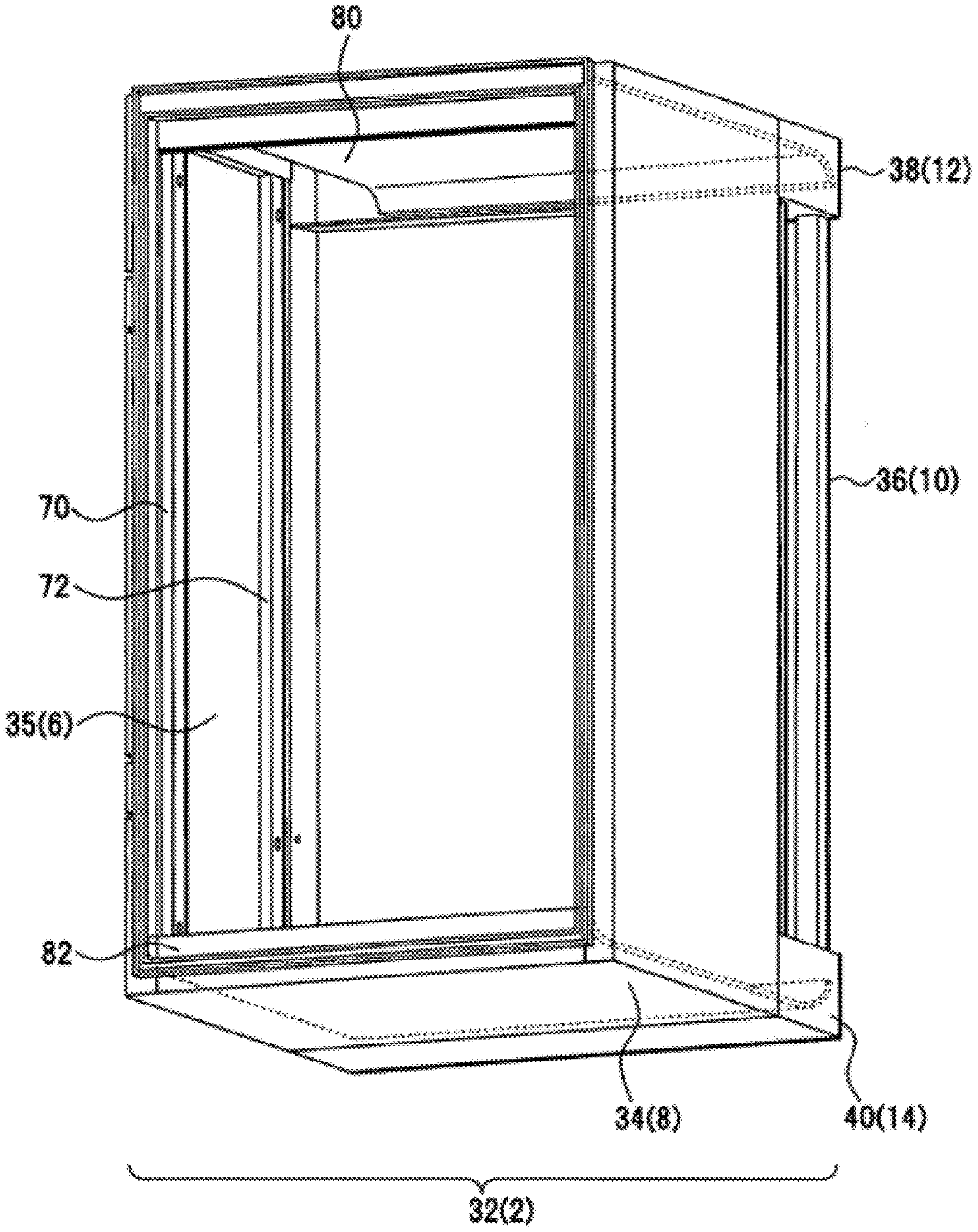
FIG. 9 illustrates an example of a air directing plate.

FIG. 9 illustrates an example of an air directing plate. As illustrated in FIG. 9, a portion of the air directing plate 80 on the connection portion 38 side is formed with a bent portion, and air P1 that has flowed into the connection portion 38 side is guided towards the ducts 36 side. In a similar manner, a portion of the air directing plate 82 on the connection portion 40 side is formed with a bent portion, and the air P2 flowing in from the ducts 36 is guided towards the housing portion 35 side. The bent portions may be an example of a contact wall.

Vertical wall portions may be formed in the air directing plates 80 and 82 directly above, directly below, or in the vicinity of the fans 22 on the housing portion 35 side, for example, so that the air between the connection portions 38 and 40 and the housing portion 35 is facilitated to flow in a certain direction.

<Connection of the Ducts 36>

Figure 10:
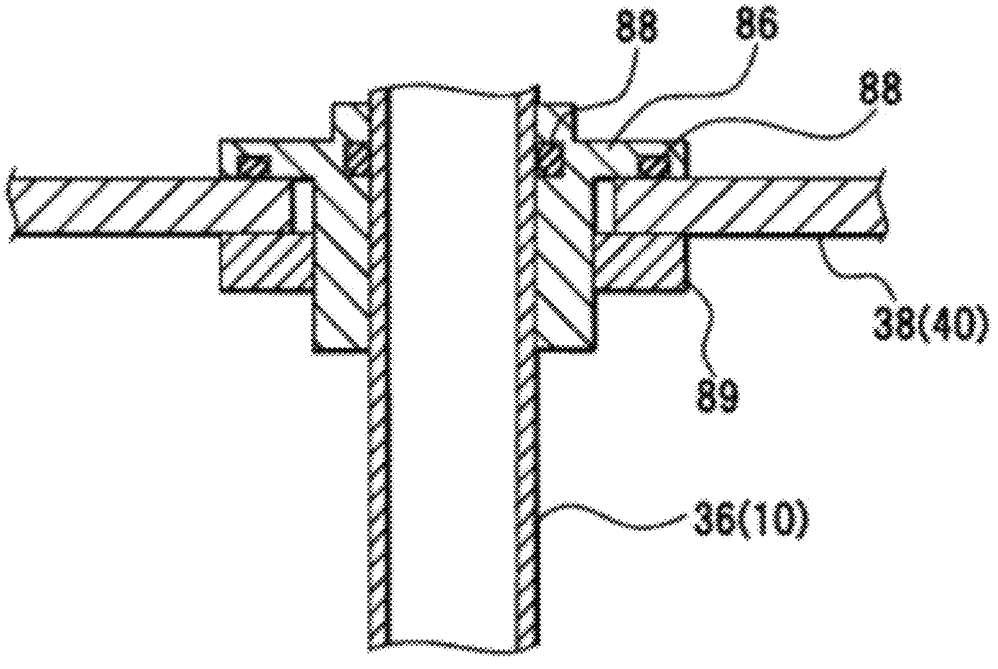
FIG. 10 illustrates an example of an installation structure of a duct with respect to a housing.

FIG. 10 illustrates an example of an installation structure of a duct with respect to a housing. FIG. 10 illustrates a state in which the duct 36 is coupled to the connection portions 38 or 40.

In installing the duct 36, connection may be performed while maintaining the sealability with respect to the connection portions 38 and 40. For example, in the connection portion with each of the connection portions 38 and 40, for example, a flange 86 may be interposed, and the duct 36 may be firmly fastened towards each of the connection portions 38 and 40 by using a nut 89, which is an example of a fixing member, from the outer side. The flange 86 includes a waterproof packing 88 at a contact portion with the external surface of the duct 36 and at a conduct portion with the internal wall surface of the connection portion 38 or 40 such that the connection portion 38 or 40 is blocked from the external air. By adopting such a structure for tightening performed by the flange 86 and the nut 89, it will be possible to perform retightening of the nut 89 when replacing the duct 36 and when maintaining sealability. Accordingly, ease of maintenance may be increased.

In the connection between the ducts 36 and the connection portions 38 and 40, for example, the connection portion may be braised or may be integrated by welding.

<Modification of the Ducts 36>

Figure 11A:
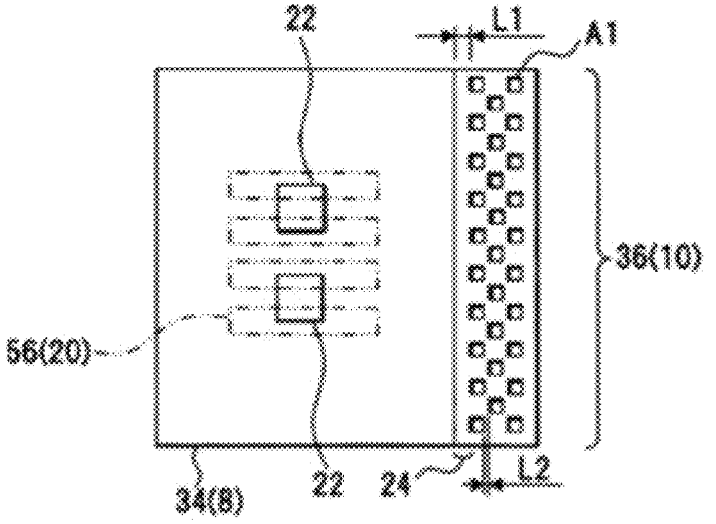
FIGS. 11A to 11C each illustrate an example of an arrangement of a duct.
Figure 11B:
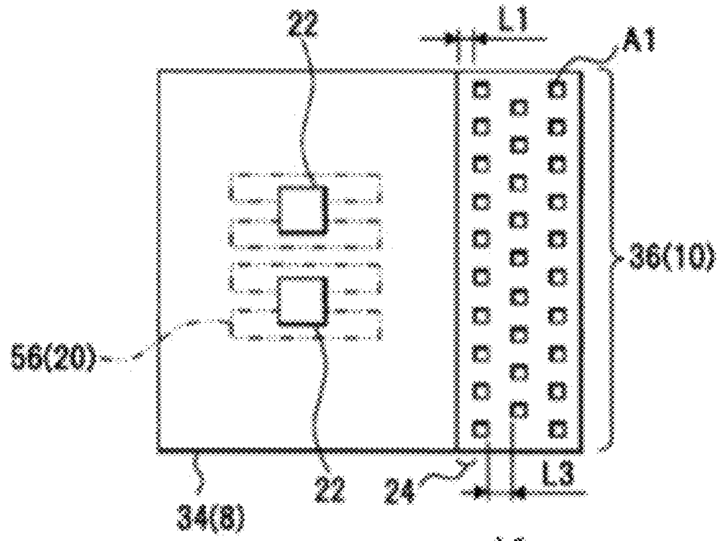
Figure 11C:
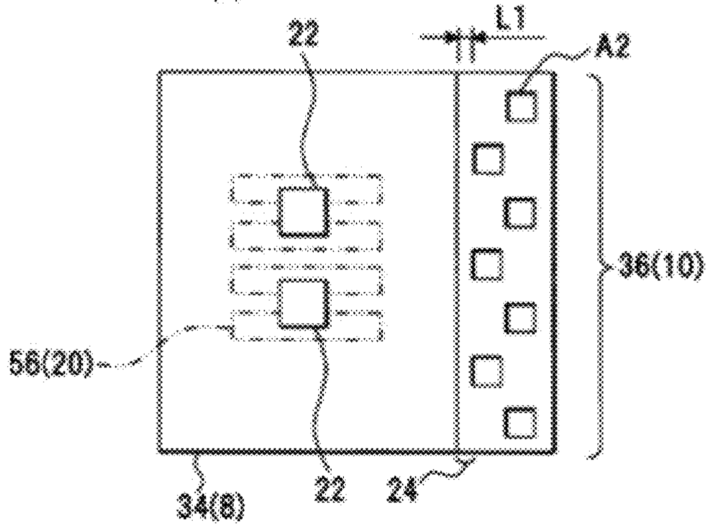

FIGS. 11A to 11C each illustrate an example of an arrangement of a duct. The ducts 36 illustrated in FIG. 11A are arranged in three lines in the front-rear direction of the main body portion 34. The number of ducts 36 in the second line is reduced and each line of ducts is offset in the left-right direction such that the ducts 36 in the second line are disposed in an oblique direction with respect to the ducts 36 in the other lines. The arrangement intervals L2 of the ducts 36 between each line may be set at substantially the same intervals as the arrangement interval L1 (FIG. 4) of the ducts 36 adjacent to the main body portion 34, for example.

As illustrated in FIG. 11B, for example, in the device case 32, large connection portions 38 and 40 may be disposed on the rear side of the main body portion 34 and the arrangement intervals L3 between each line of the ducts 36 may be set large. In such a case, the device case 32 will not be easily affected by the heat radiated between the adjacent ducts 36 and since the external air flows between the ducts 36 more easily, the cooling function may be enhanced.

In the device case 32 illustrated in FIG. 11C, for example, the opening areas A2 of the ducts 36 are formed larger and the arranged numbers and the number of arranged lines are reduced. As above, increase in the parking area A2 reduces the flow velocity of the air flowing inside the duct 36 and the flowing time of the air P1 to pass through the inside of the duct 36 is increased. Accordingly, the heat radiation function may be improved.

The above forming conditions of the duct 36 may be set in accordance with the air temperature inside the housing portion 35, the preset rotation speeds of the fans 22, the working condition of the wireless installation 30, or the like.

The high-temperature air circulating inside the housing portion 35 without being stagnated may improve the cooling function. By including ducts 36 through which high-temperature air is made to flow, reducing the size and weight of the device case 32 may be achieved without providing a space to circulate air inside the housing portion 35. By being provided with a space between the main body portion 34 and the ducts 36, the ducts 36 radiate heat without being affected by the heat from the electronic component 56 inside the housing portion 35. Accordingly, the cooling capacity may be increased. Since air flows inside the installed ducts 36 in the longitudinal direction of the device case 32, the heat radiation section is configured long. Accordingly, the heat radiation capacity may be increased. The heat radiation condition in the ducts 36 may be set based on the temperature condition inside the housing portion 35. Accordingly, handiness of the device case 32 may be increased. Compared with a case in which a plurality of large fins are formed in the housing, the structure in which radiation of heat is performed separately from the main body portion 34 by using the ducts 36 may reduce the size and the weight of the drive case 32.

Figure 12:
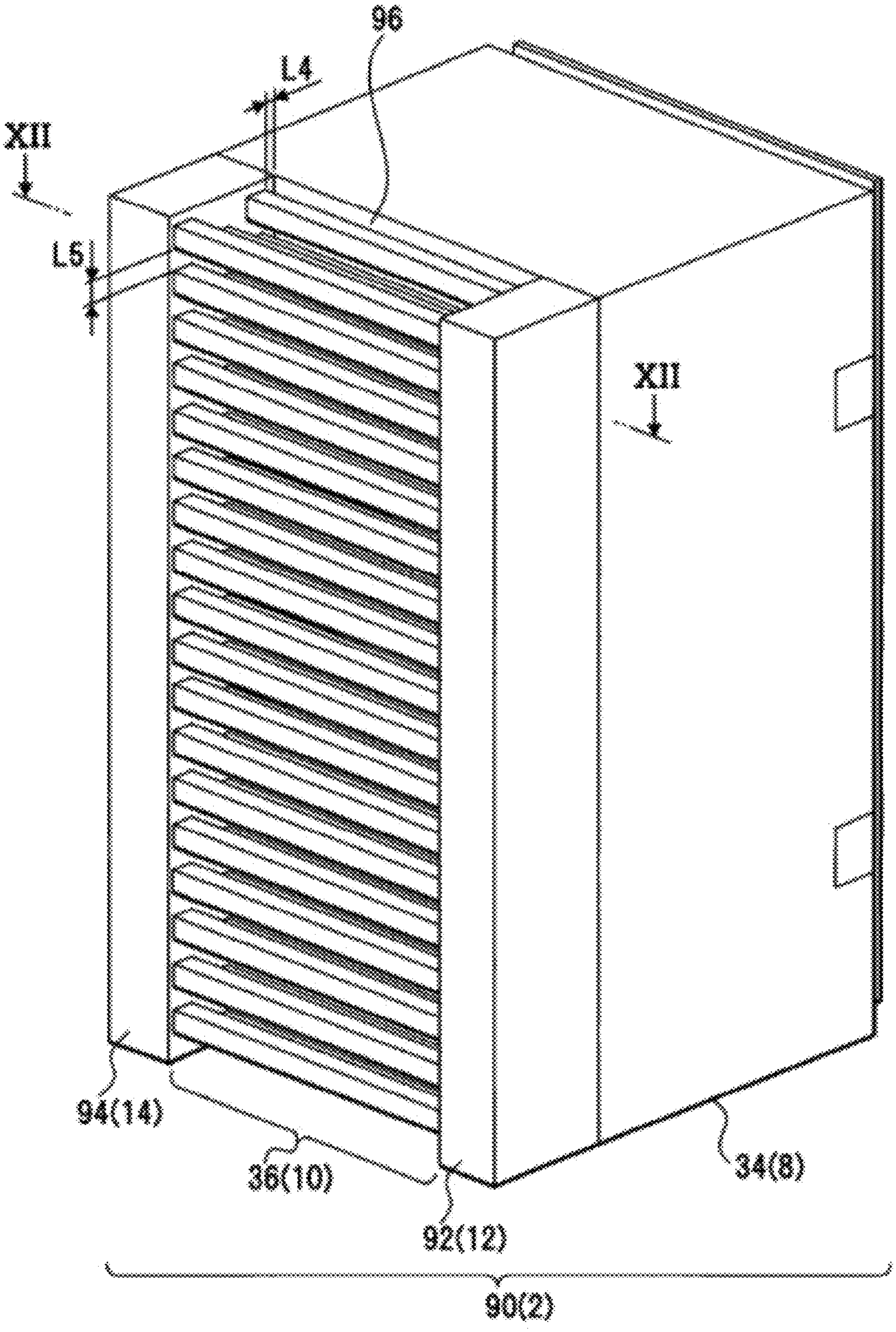
FIG. 12 illustrates an example of an electronic device housing.

FIG. 12 illustrates an example of an electronic device housing.

A housing 90 may be an example of the electronic device housing and may be used as an exterior housing of the wireless installation that is installed indoors and outdoors and as an exterior housing of other electronic devices. Connection portions 92 and 94 having certain widths and with substantially the same heights as the height of the main body portion 34 are formed in the housing 90 in the left and right rear sides of the main body portion 34, for example. A plurality of ducts 36 formed at certain intervals L5 are connected between the opposing surfaces of the connection portions 92 and 94 in the horizontal direction with respect to the mounting surface of the housing 90 or at an angle approximate to the horizontal direction. The inside of the ducts 36 are hollow and the ducts 36 are in communication with the housing portion 35 inside the main body portion 34 through the connection portions 92 and 94.

The ducts 36 on the main body portion 34 side are disposed with a space having a certain width L4 with respect to the rear plate 96 of the main body portion 34. Accordingly, a state allowing a certain amount of external air to pass between the ducts 36 and the main body portion 34 is set.

Figure 13:
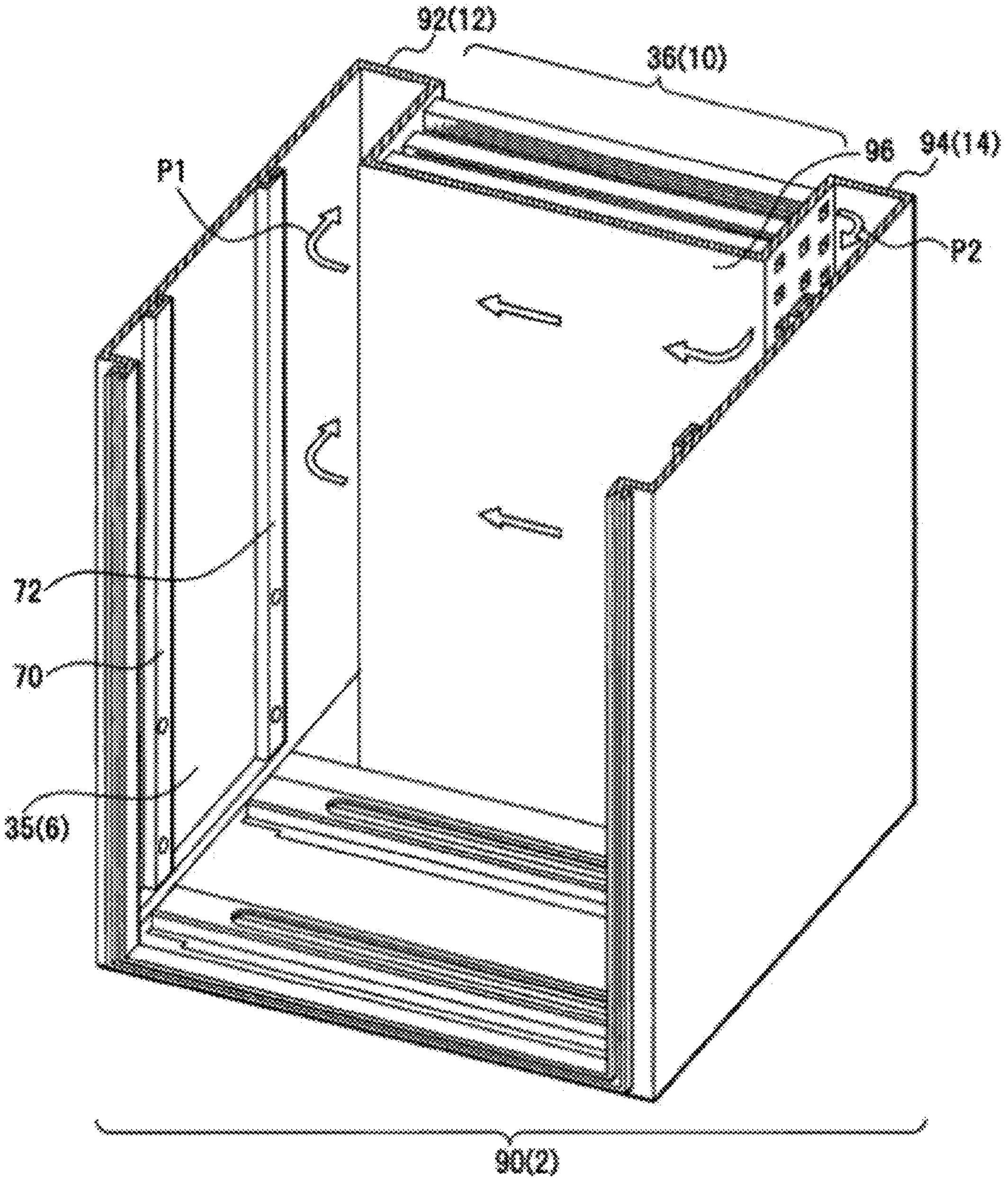
FIG. 13 illustrates an example of an internal shape of a housing.

FIG. 13 illustrates an example of an internal shape of a housing. As illustrated in FIG. 13, the opening portions of the ducts 36 are arranged in the height direction and on the rear side of the main body portion 34. For example, air P2 flows into the housing portion 35 from the ducts 36 through the connection portion 94 and flows in the horizontal direction. In the housing 90, the air P1 that has passed through the housing portion 35 is discharged into the ducts 36 through the connection portion 92. Accordingly, air circulates between the main body portion 34 and the ducts 36.

<Electronic Device 100 Using the Housing 90>

Figure 14:
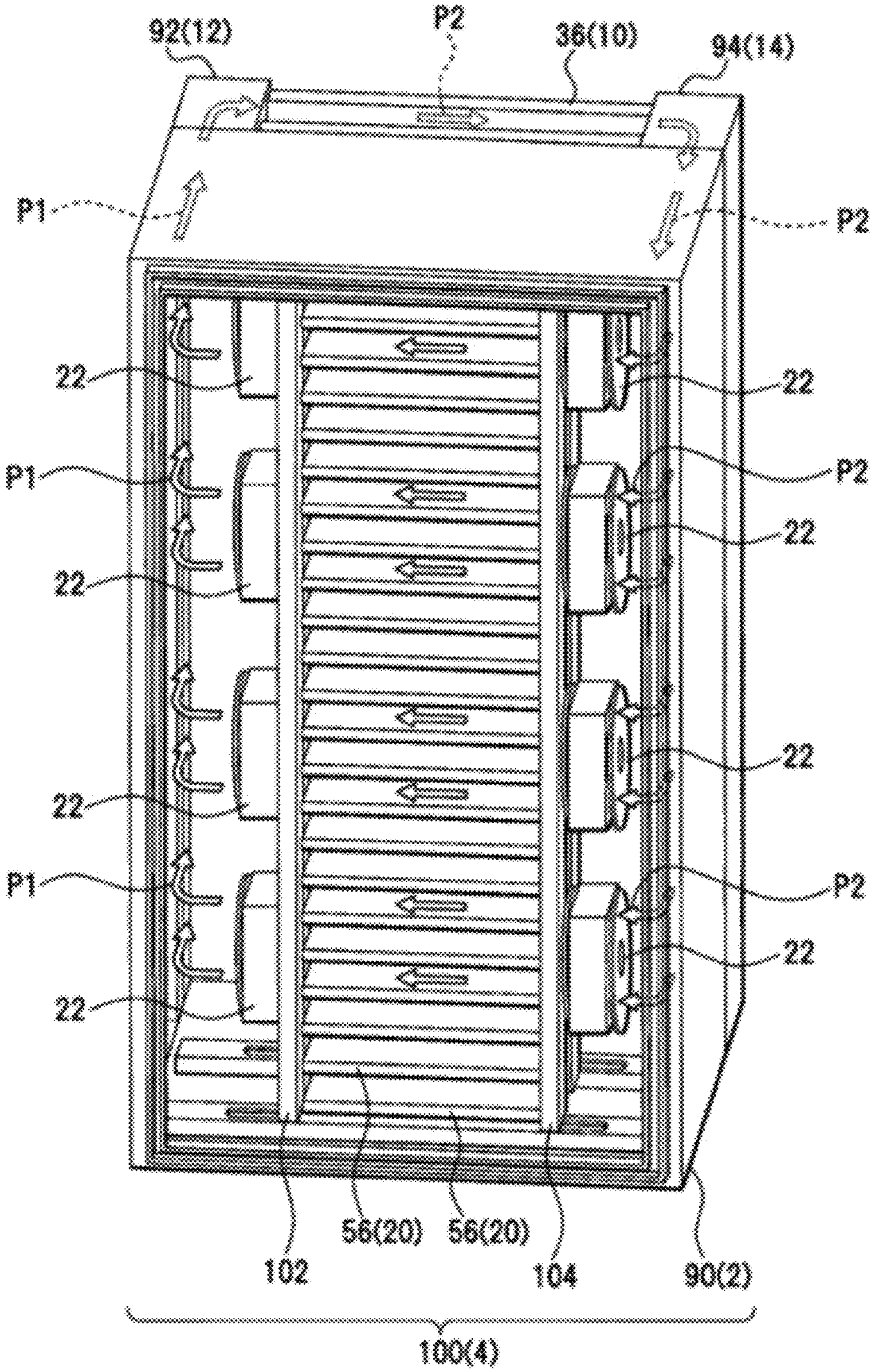
FIG. 14 illustrates an example of a state inside an electronic device.

FIG. 14 illustrates an example of a state inside an electronic device.

An electronic device 100 includes a wireless station, for example. A plurality of radio packages 56 are housed with shelves 102 and 104 formed inside the housing portion 35. BMB 54 and other functional components are mounted in the housing portion 35. In the shelves 102 and 104, a plurality of fans 22 are disposed along the lateral sides of the disposed radio packages 56. With the rotation of the fans 22, the air inside the housing portion 35 flows in a certain direction. Accordingly, the circulation direction of the air inside the housing 90 is set.

In the electronic device 100, the air that has been heated by the heat generated by the radio packages 56 is made to flow to the ducts 36 through the connection portion 92, is made to radiate heat inside the ducts 36 with the external air, and flows into the housing portion 35 through the connection portion 94. In the electronic device 100, since the heat inside the housing portion 35 is efficiently radiated to the outside of the housing 90 by circulation of the air, abnormal overheating of the radio packages 56 is reduced and, accordingly, stable operation may be obtained.

Figure 15:
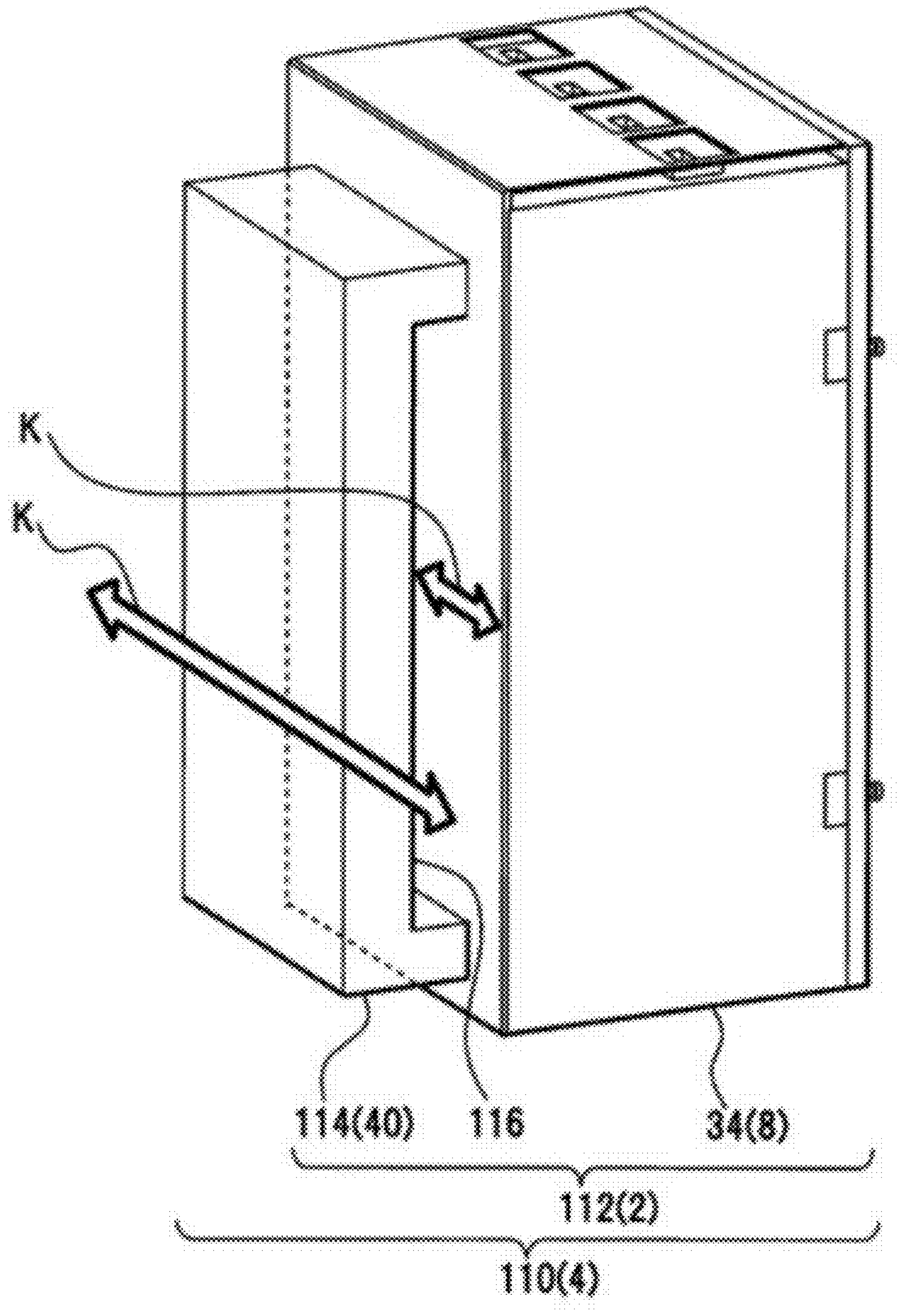
FIG. 15 illustrates an example of an electronic device housing.

FIG. 15 illustrates an example of an electronic device housing.

In a housing 112 of an electronic device 110, a duct 114 is provided on the rear side of the main body portion 34. For example, the body portion of the duct 114 includes a single and wide radiation surface that is arranged so as to be parallel with the rear surface portion of the main body portion 34 or at an angle approximate to the parallel arrangement. The duct 114 has a substantially certain length in the up-down direction of the body portion and the upper and lower ends are bent towards the main body portion 34 side and are coupled to the main body portion 34. In the duct 114, radiation of heat of the air flowing therein is also performed in the bent portions at the upper and lower ends. For example, the duct 114 takes the high-temperature air P1, which has been taken in from the main body portion 34, into the single flow path and radiates heat to the external air through a wide surface. No connection portion is formed in the housing 112 between the main body portion 34 and the duct 114, and air flows into the duct 114 directly from the main body portion 34.

The duct 114 is formed in a C-shape by coupling the upper and lower ends thereof to certain upper and lower positions of the rear surface portion of the main body portion 34. Accordingly, a space 116 having a specific distance between the main body portion 34 is formed. Since external air K is made to flow in the space 116, heat exchange is performed between the external air K, and the body portion of the duct 114 and the both end sides and effect of the heat between the rear side of the main body portion 34 and the duct 114 may be reduced.

<State inside the Electronic Device 110>

Figure 16:
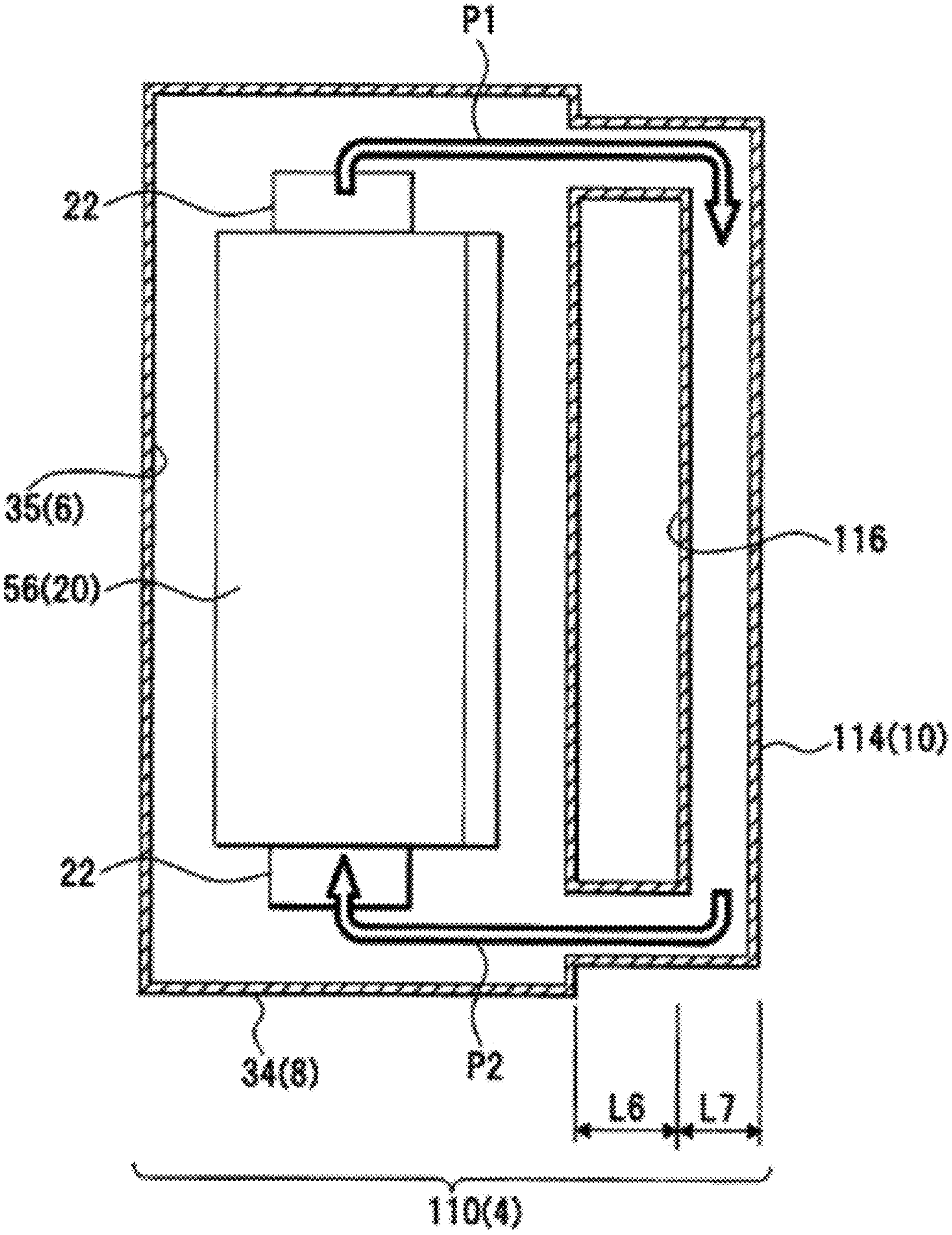
FIG. 16 illustrates an example of an air flowing state inside an electronic device.

FIG. 16 illustrates an example of an air flowing state inside an electronic device. As illustrated in FIG. 16, the electronic device 110 includes, for example, a radio package 56 installed therein, which is an example of the heat generating component installed inside the housing portion 35 of the main body portion 34, and fans 22 that makes the air flow. In the housing 112, the air inside the housing portion 35 flows into the duct 114 from the connection portion on the upper portion side and cooled air is taken in from the connection portion on the lower portion side. Accordingly, circulation of air between the duct 114 is performed. The space 116 may be set with a distance L6 that is based on the external dimensions of the housing 112 and the insulation space and in which the duct 114 is not affected by the heat from the main body portion 34 side. The thickness L7 of the duct 114 may be set in accordance with the volume of the housing portion 35 and the air flow rates of the fans 22, for example.

Figure 17:
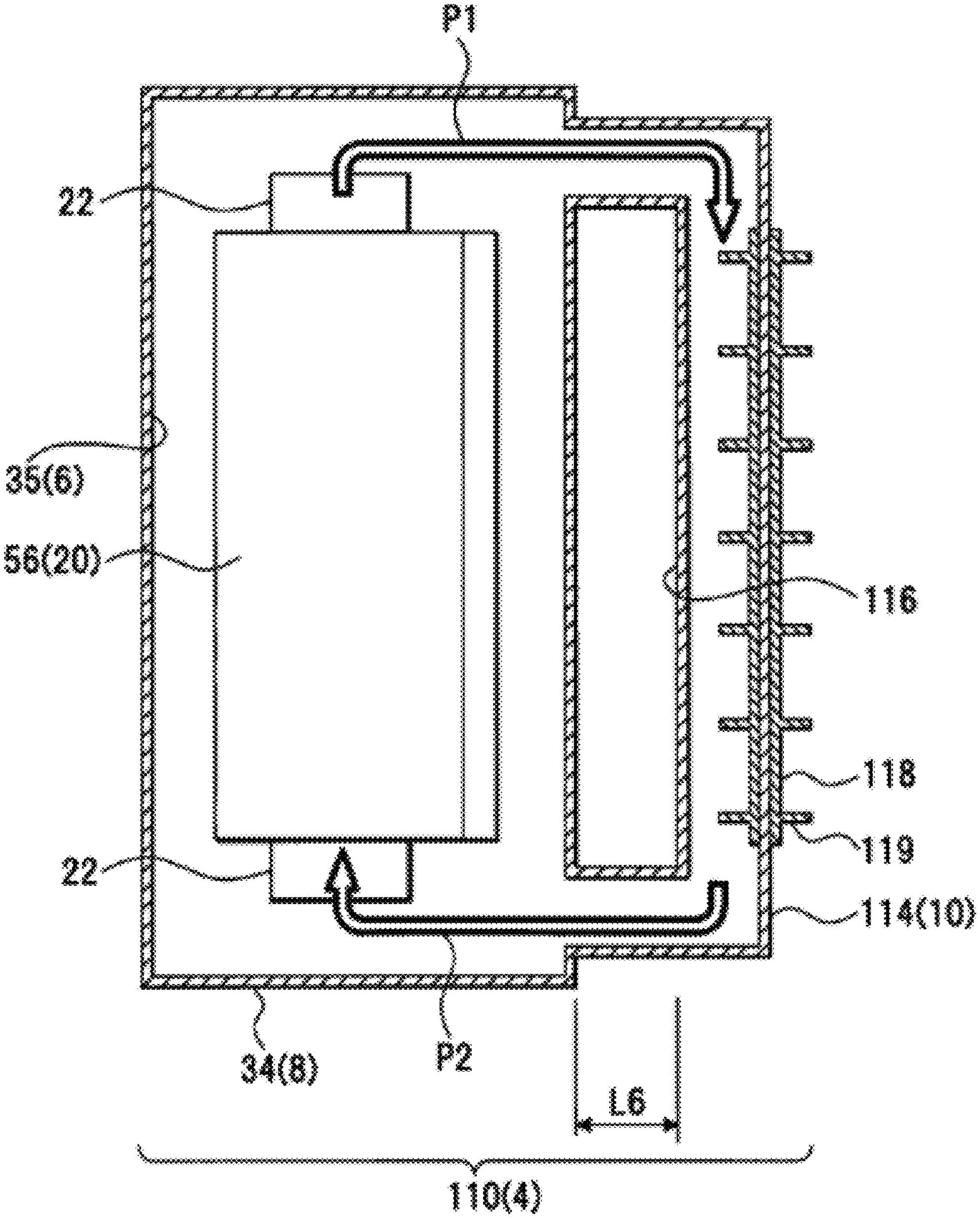
FIG. 17 illustrates an example of a duct.

FIG. 17 illustrates an example of a duct. As illustrated in FIG. 17, for example, the duct 114 utilizing the wide-width radiation surface may include fins 119 serving as a heat radiation component in the inner side and the outer side of the body portion or in either one of the inner side and the outer side of the body portion. The fins 119 may be, for example, installed on the flat surface portion of the body portion through a fin base 118. The heat exchange efficiency between the air flowing inside the duct 114 and the external air may be increased. The fins 119 inside the duct 114 may be formed short so as not to impede the air flow or the fins 119 may be formed discontinuously in the width direction and a plurality of fins may be disposed so as to be offset in the up-down direction with respect to each other.

Figure 18:
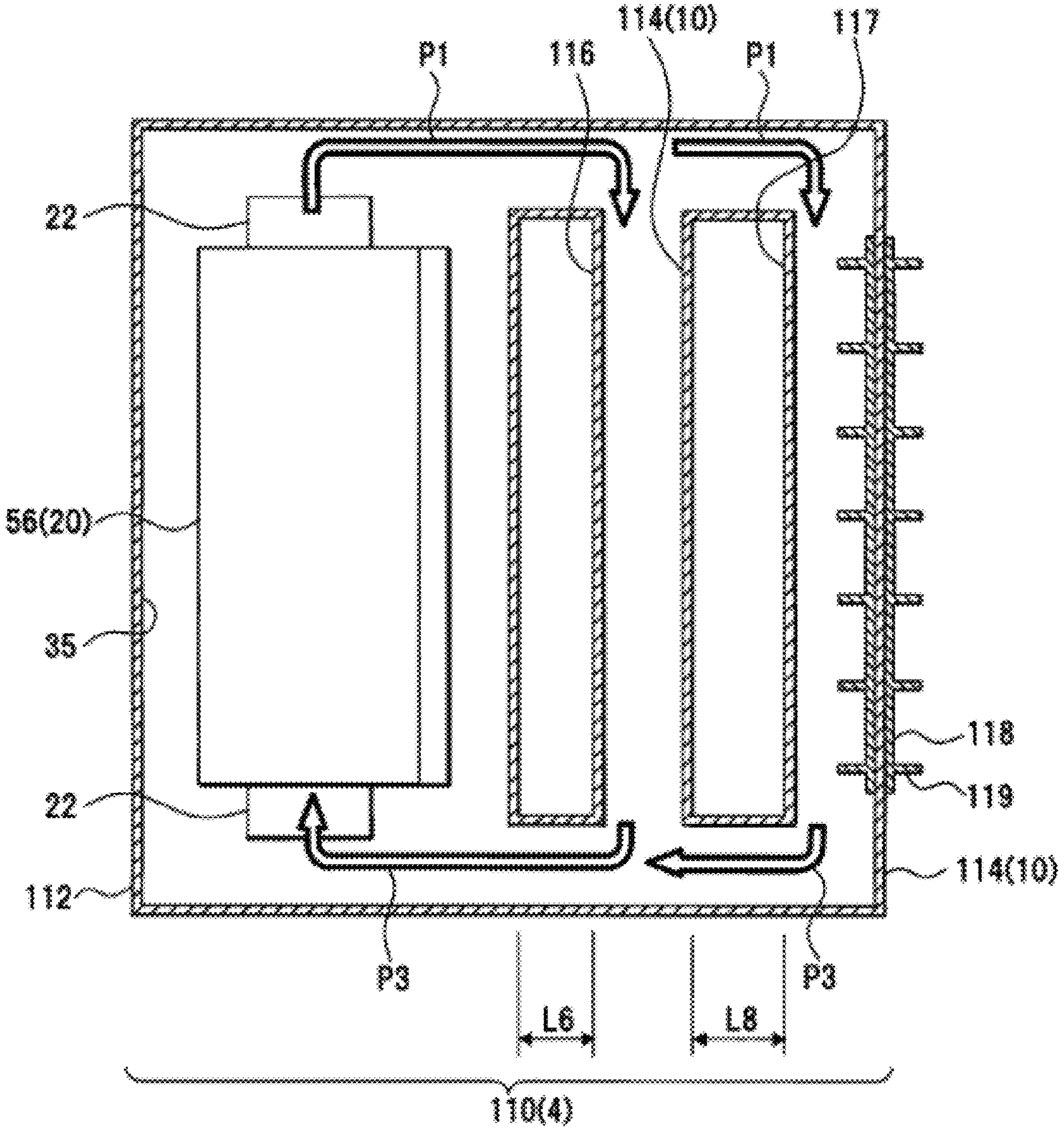
FIG. 18 illustrates an example of a duct.

FIG. 18 illustrates an example of a duct. As illustrated in FIG. 18, for example, a plurality of ducts 114 may be installed so as to be parallel to the rear side of the main body portion 34 of the housing 112. In such a case, a space 117 having a substantially certain distance L8 is formed between the ducts 114. Similar to the space 116, in the space 117, by having the external air pass through the inside, heat interference between the parallel ducts 114 is reduced and the contact area between the body portion and the external air is secured. For example, the duct 114 formed on the outside may be provided with the fins 119.

In the housing 112, the air P1 that has been heated in the housing portion 35 is taken into either one of the parallel ducts 114 sides and radiation of heat is performed by heat exchange with the external air. The cooled air P2 is returned to the housing portion 35 side. As described above, the circulating the air by the ducts 114 cools the electronic device 110.

The two upper and lower end portions of each duct 114 may be directly coupled to the main body portion 34. Connection portions may be formed in portions on the rear side of the main body portion 34, for example, and a single wide-width duct 114 having a C-shape or a linear shape may be coupled to the connection portion.

The heated air P1 circulating inside the housing portion 35 without being stagnated may improve the cooling function. Since a duct 114 through which the heated air P1 is made to flow is provided, a space that circulates air inside the housing portion 35 may not be provided. Spaces 116 and 117 are provided between the main body portion 34 and the ducts 114. Accordingly, the ducts 114 may cool the air P1 efficiently and the ducts 114 may not be affected by the heat from the housing portion 35.

Figure 19:
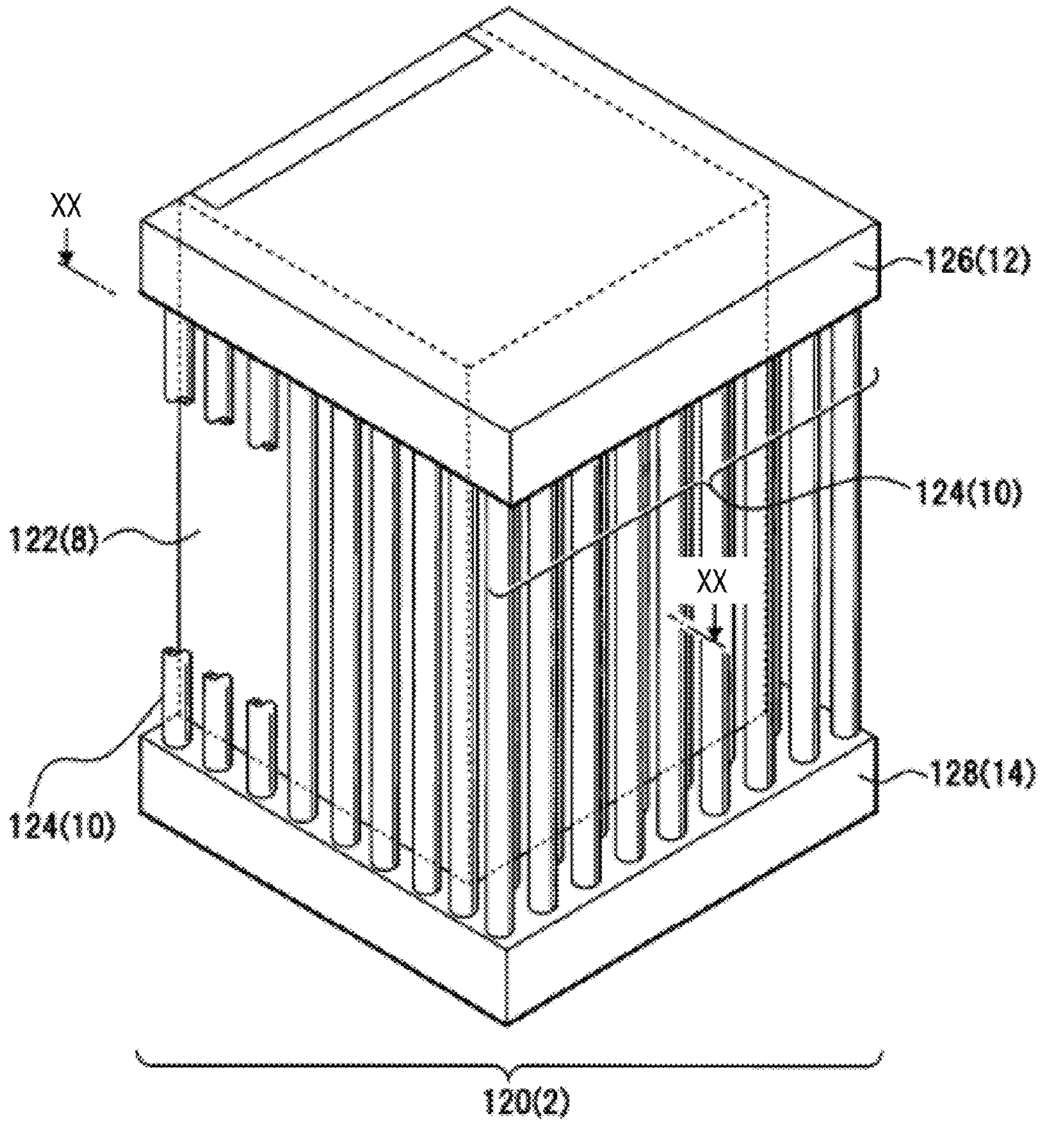
FIG. 19 is an example of an electronic device housing.

FIG. 19 is an example of an electronic device housing.

As illustrated in FIG. 19, in a housing 120, ducts 124 are disposed on a rear side of a main body portion 122 as well as on the left lateral surface side and the right lateral surface side. In the housing 120, for example, connection portions 126 and 128 are formed on the upper portion side and the lower portion side of the main body portion 122 so as to have a certain thickness in the height direction and so as to protrude towards the rear side and both the left and right sides. The plurality of ducts 124 are disposed between the opposing surfaces of the connection portions 126 and 128.

Figure 20:
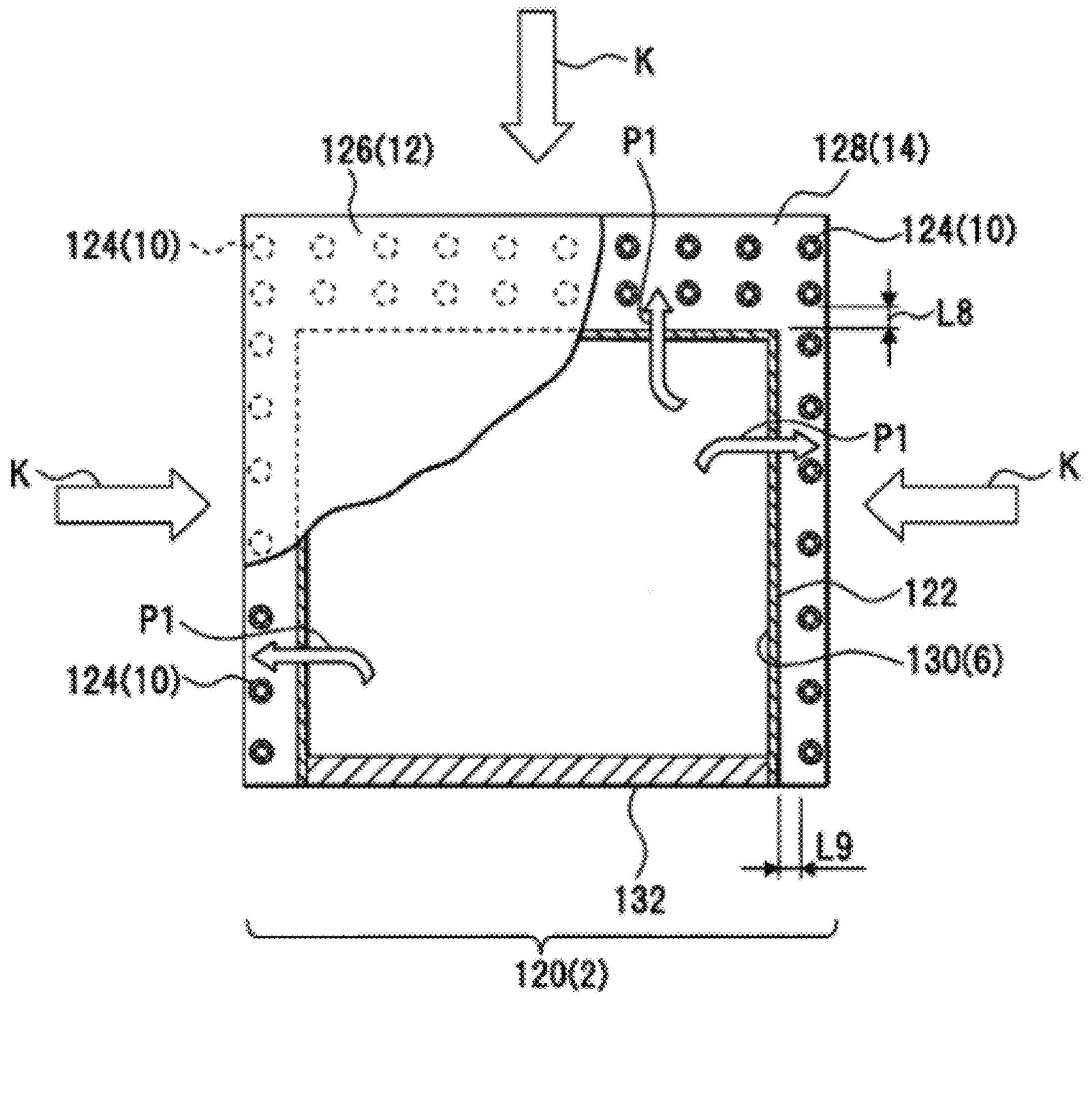
FIG. 20 illustrates an example of an arrangement of a housing portion and the duct, and an air flowing state.

FIG. 20 illustrates an example of an arrangement of a housing portion and a duct, and an air flowing state. As illustrated in FIG. 20, for example, the ducts 124 are disposed with an interval having a certain distance L9 with the main body portion 122. Accordingly, the ducts 124 may not receive heat interference from the heat generating component housed inside a housing portion 130. An openable and closable front panel 132 for performing replacement of the components housed inside the housing portion 130 is installed in the front side of the housing 120 in a sealed state.

In the housing 120, for example, the air that has been heated inside the housing portion 130 flows into the ducts 124 from the upper portion side through the connection portion 126. The air radiates heat inside the ducts 124 by performing heat exchange with the external air K, is cooled, and is made to flow towards the lower portion side of the housing portion 130 through the connection portion 128. Accordingly, the air circulates between the housing portion 130 and the ducts 124.

The connection portions 126 and 128 may be formed by protruding a portion on the upper portion side or the lower portion side of the main body portion 122, or a connection member may be installed on the upper side and the underside of the main body portion 122.

Since a large disposing space of the ducts 124 is not occupied in the rear side of the housing 120, the housing 120 in the front-rear direction may be formed with a short length. Since the ducts 124 are disposed around the main body portion 122, the air inside the housing portion 130 does not concentrate in the lateral side and the air on the lateral side or the front side of the housing portion 130 is taken into the ducts 124 that are in the vicinity of the lateral side or the front side. Accordingly, the cooling efficiency may be increased.

Figure 21:
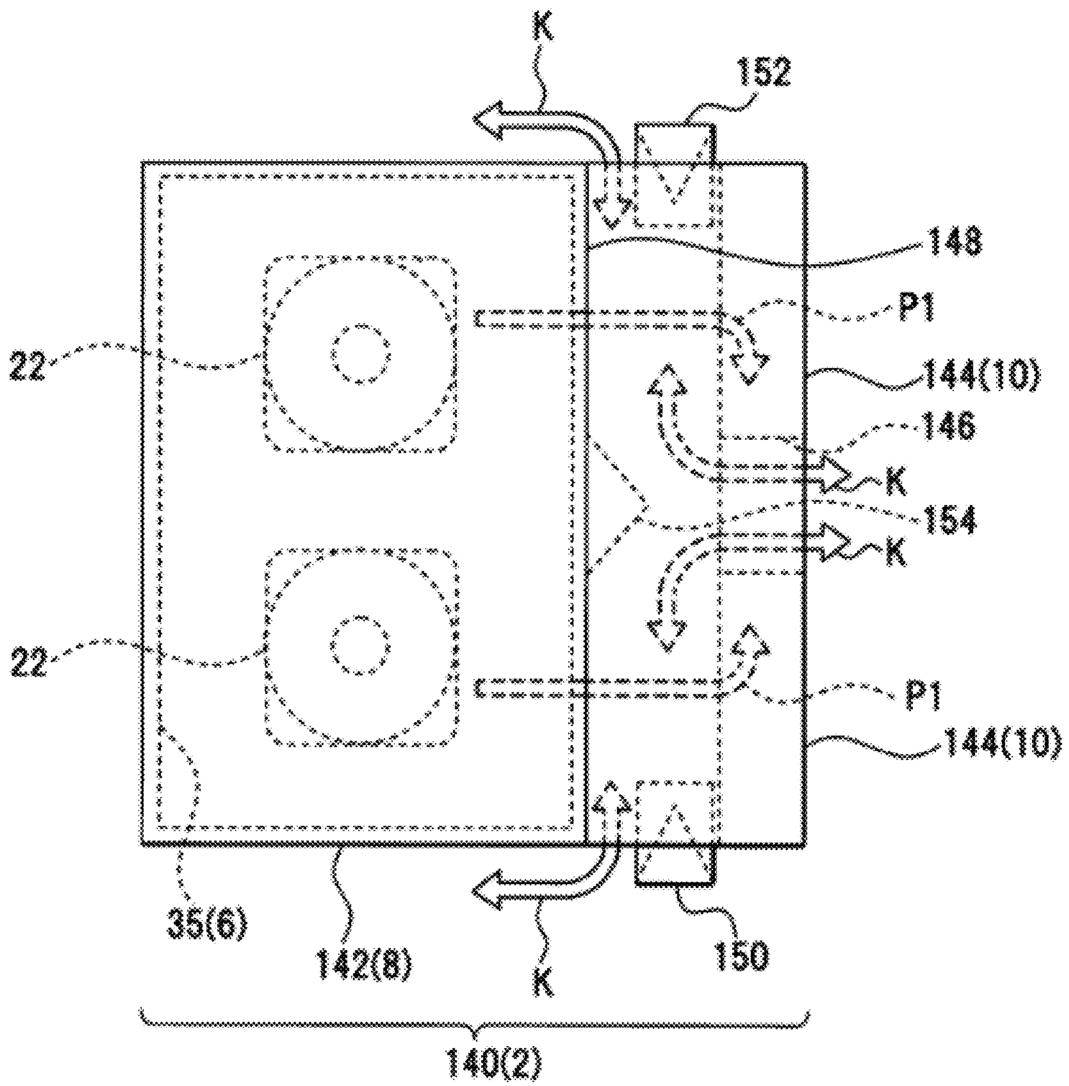
FIG. 21 illustrates an example of a plan view of an electronic device housing.

FIG. 21 illustrates an example of a plan view of an electronic device housing. In FIG. 21, a configuration of the electronic device housing on the upper portion side is illustrated.

In an electronic device housing 140, a duct 144 that radiate heat by flowing air inside the case is formed on a rear side of a main body portion 142 in which the housing portion 35 is formed. The duct 144, for example, has a certain width in the front-rear direction of the main body portion 142 and is formed so as to have a square or an annular cross-sectional shape. Considering the heat exchange efficiency between the heated air P1 that is made to flow inside and the external air K, the thickness of the duct 144 may be formed thin. The duct 144 may be formed with a width that is substantially the same as the left-right width of the rear surface portion of the main body portion 142 and two flow paths are formed in the body portion that is formed in parallel to the rear surface portion. A passage window portion 146 that passes external air K is formed in the middle of the body portion of the duct 144.

In the duct 144, a space 148 that passes the external air K therethrough and that has a substantially certain width is formed between the body portion and the rear surface portion of the main body portion 142. The space 148 may be an example of the ventilation path. The space 148 allows the external air K to flow from both the left and right lateral sides of the electronic device housing 140, for example.

The electronic device housing 140 is provided with air directing components 150 and 152 that guides the external air K towards both left and right end sides or either of the end sides of the space 148. The air directing components 150 and 152 may each be an example of an air guiding member. For example, the air directing components 150 and 152 may each have a triangular shaped section and may be formed such that inclined surfaces are oriented in the front-rear direction of the electronic device housing 140 and that the edges of the inclined surfaces are oriented towards the space 148. In the space 148, for example, an air directing component 154 that has inclined surfaces is installed on a portion of the rear surface portion side of the main body portion 142. The end of the inclination is oriented towards the passage window portion 146. Accordingly, the external air K that has been guided into the space 148 is made to flow towards the passage window portion 146 with the air directing component 154 after heat has been exchanged on the surface of the duct 144, for example. The external air K may be taken into the space 148 through the passage window portion 146 and may be directed towards both the left and right sides of the space 148 through the air directing component 154, and, then, may be discharged from both the left end side and the right end side of the space 148 in a certain direction with the air directing components 150 and 152.

Figure 22:
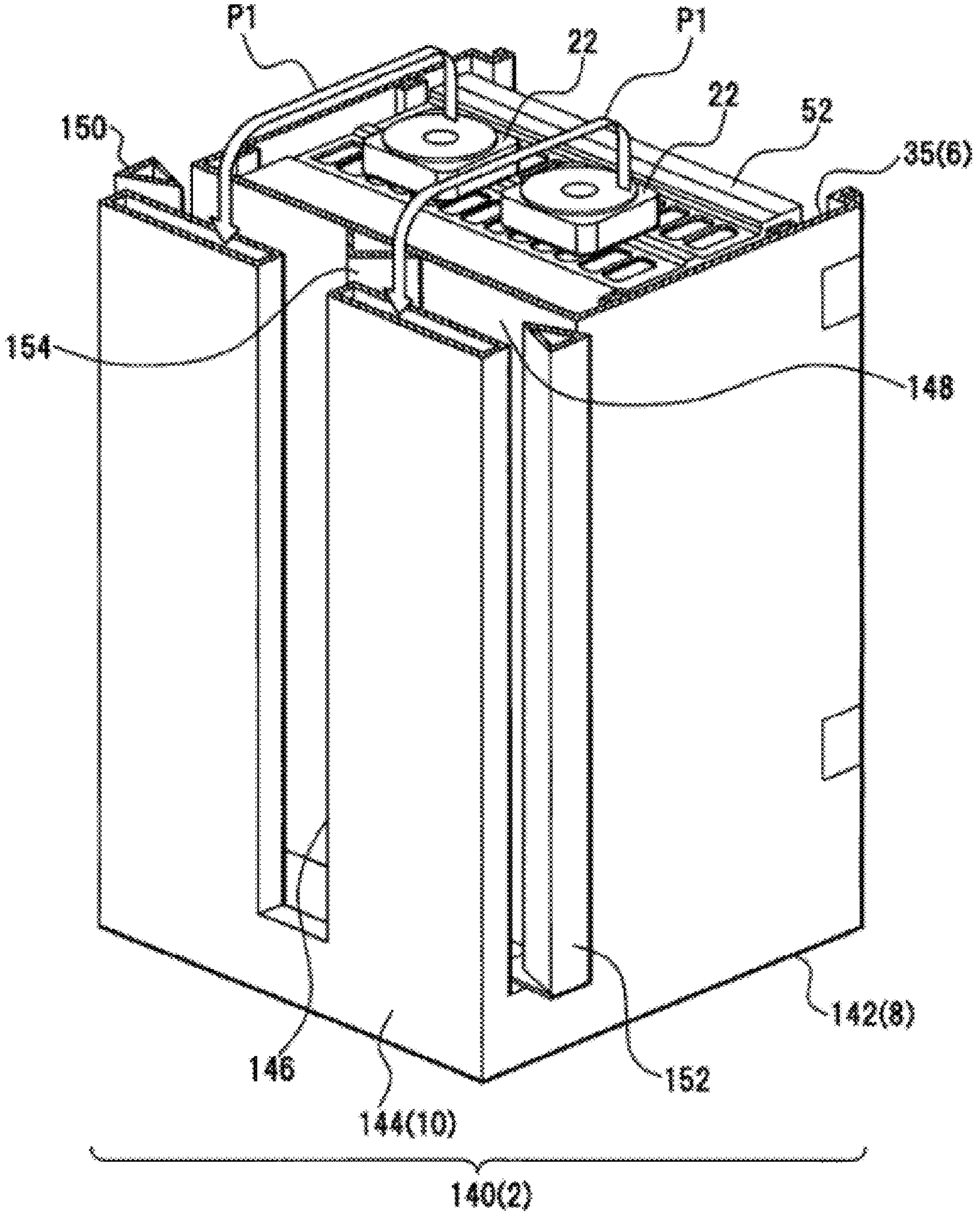
FIG. 22 illustrates an example of a section of an electronic device housing.

FIG. 22 illustrates an example of a section of an electronic device housing. As illustrated in FIG. 22, for example, the upper and lower end portions of the body portion of the duct 144 are bent towards the rear surface portion side of the main body portion 142 and the duct 144 are directly coupled to the upper portion side and the lower portion side of the rear surface portion of the main body portion 142. The main body portion 142 and the duct 144 are coupled to each other by welding, brazing, or other sealing members so as to maintain the sealed state between the housing portion 35 that is inside and the inner tube of the duct 144. The air directing components 150 and 152 are formed so as to have substantially the same height as the opening height of the opening 148 of the duct 144 and the end surface portions of the air directing components 150 and 152 are integrated with the base coupling the duct 144 and the main body portion 142. The air directing components 150 and 152, for example, are installed so as to be capable of being attached and detached with respect to the duct 144, or are installed so as to enable the inclination direction to be voluntarily adjusted. Accordingly, the flowing state of the external air K with respect to the space 148 may be controlled in accordance with the wind direction of the external air serving as an environment in which the electronic device housing 140 is disposed.

A portion of both the upper and lower end sides of the duct 144 may be bent at the connection portion between the duct 144 and the main body portion 142, or a connection portion may be formed by protruding a portion of the rear side of the main body portion 142. The duct 144 may be coupled between the opposing surfaces of the connection portion.

A large amount of external air, which is flowing around the electronic device housing 140, being guided towards the space 148 side with the air directing components 150 and 152 may increase the heat exchange efficiency of the heated air P1 flowing inside the duct 144. By combining the air directing components 150, 152, and 154, the external air is directed so that a specific flow direction is set in the space 148 and the passage window portion 146 and the external air is brought into contact with the surface of the duct 144 in an efficient manner. Accordingly, the function of cooling the air inside the case may be enhanced.

Portions of the rear side of the main body portion 8, 34 may be protruded to form the connection portions 12, 14, 38, 40, and the ducts 10, 36 may be coupled with in the connection portions 12, 14, 38, 40. The connection portions 12, 14, 38, 40, and the ducts 10, 36 may be provided on either of the front surface side or the lateral surface side of the main body portion 8, 34. The connection portions 12, 14, 38, 40 and the ducts 10, 36 may be provided on one surface of the main body portion 8, 34 or may be formed across a plurality of sides. The length of the cooling flow path is set based on, for example, the preset temperature inside the housing portion 6, 35 and the rotation speed of the fans 22. Accordingly, the connection portions 12, 14, 38, 40 may be disposed at a position that allows the ducts 10, 36 to be formed long.

The ducts 36 may be disposed in parallel to the back surface of the main body portion 34 and may be arranged in a direction substantially orthogonal to the opposing connection portions 38, 40, 92, 94. The ducts 36 may be disposed in an oblique direction at a predetermined angle with respect to the opposing connection portions 38 and 40 or the opposing connection portions 92 and 94. The ducts 36 are not limited to linear ducts and may have shapes that are bent between the connection portions 38 and 40 or the connection portions 92 and 94. By disposing or forming the ducts 36 in the above manner, long cooling flow paths of the ducts 36 are configured. Accordingly, the cooling function may be enhanced. When the rear side of the housing is installed against a building or a pole, cases in which the ducts 36 come into contact with the subject of installation may be reduced.

Figure 23:
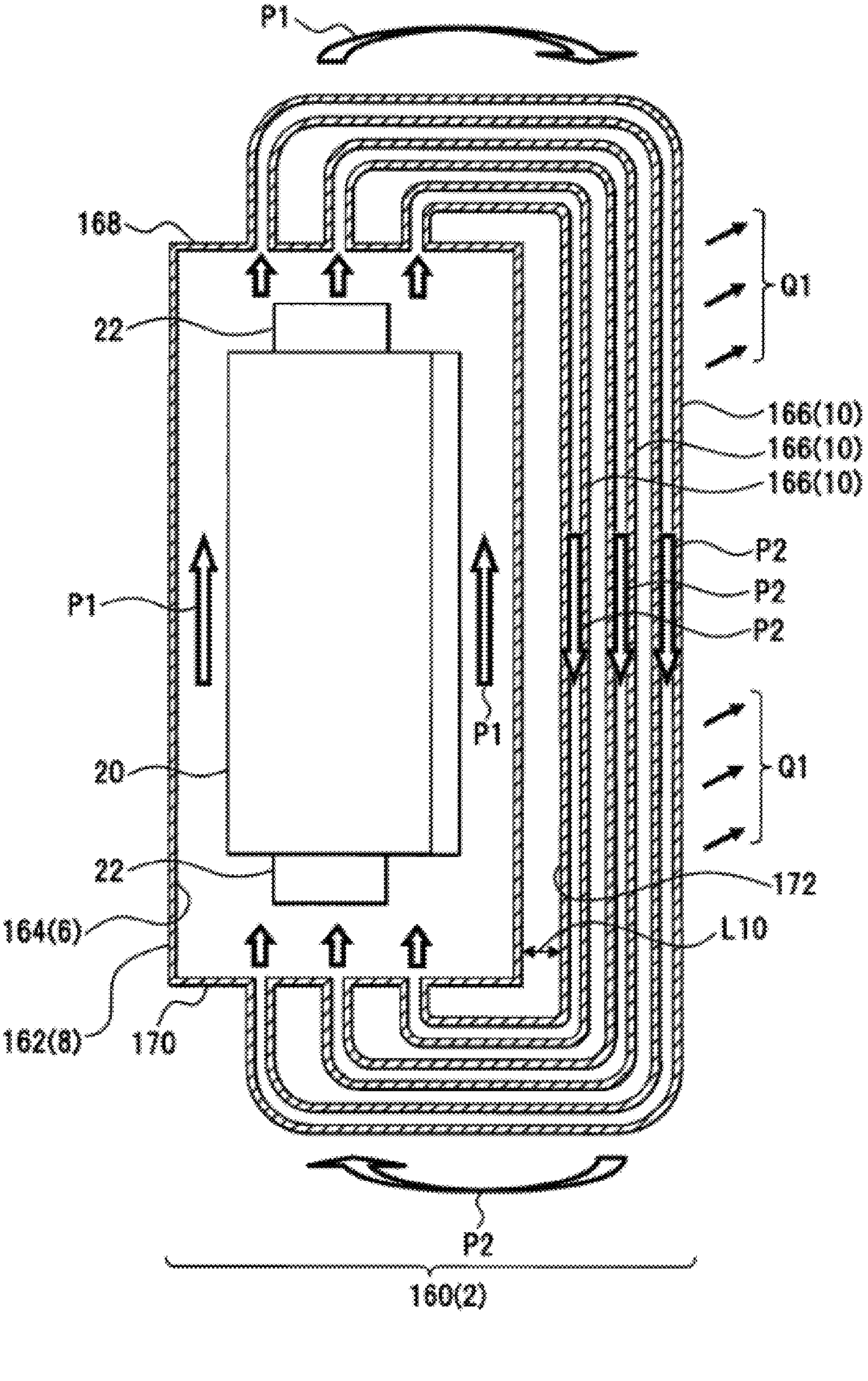
FIG. 23 illustrates an example of an electronic device housing.

FIG. 23 illustrates an example of an electronic device housing. The ducts 10 may be coupled to the rear surface portion of the housing 2 through the connection portions 12 and 14. As illustrated in FIG. 23, in an electronic device housing 160, ducts 166 are coupled to an upper surface portion 168 and a lower surface portion 170 at a body portion 162. For example, air P1 that has been heated in a housing portion 164 is taken into the ducts 166 from the top wall side of the housing portion 164, flows along the bent ducts 166 while exchanging heat with the external air, and turns into low-temperature air P2. The air P2 inside the ducts 166 is discharged to the bottom portion side of the housing portion 164 through the connection portion of the lower surface portion 170 of the body portion 162.

Any fixing member that fixes the ducts 166 to the electronic device housing 160 may be configured. For example, the ducts 166 may be supported by the building in which the electronic device housing 160 is installed or by a support pole. A supporting member may be provided that integrates the ducts 166 and the electronic device housing 160 at a certain position of the ducts 166. The ducts 166 are fixed to the electronic device housing 160 such that one of the ducts 166 is spaced apart with respect to the electronic device housing 160 at a certain distance L10 so as to form a space 172. Accordingly, effect of the heat from the exterior side of the body portion 162 to the ducts 166 may be reduced and the contact area of the ducts 166 with the external air may be set wide.

The arrangement state of the ducts 166 is set optionally in accordance with the installed environment of the electronic device housing 160, and the ease of handling may be increased. The lengths of the ducts 166 may be set regardless of the dimensions of the electronic device housing 160, and a long flow section for the air to radiate heat may be set.

Figure 24:
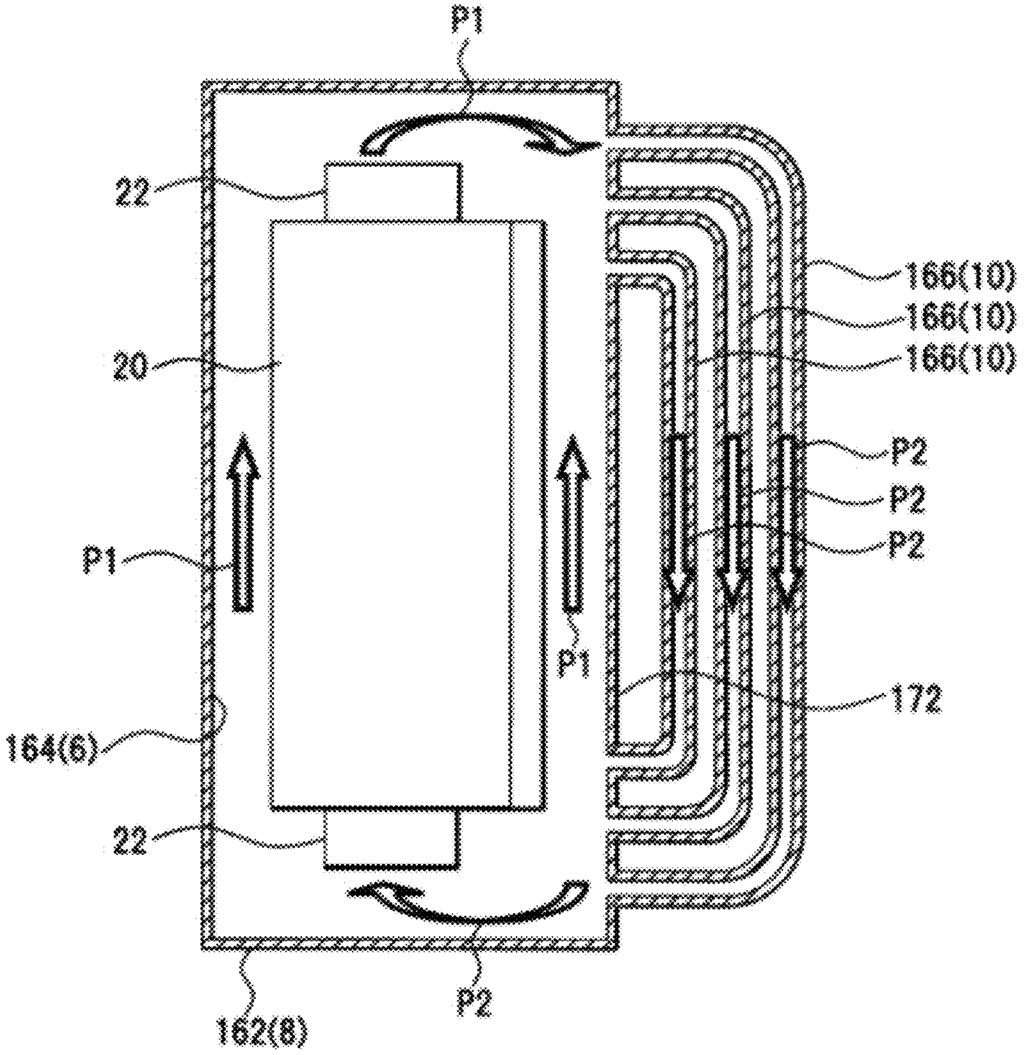
FIG. 24 illustrates an example of an electronic device housing.

Portions of the main body portion 8 of the housing 2 may be protruded and the connection portions 12 and 14 that couple the ducts 10 having substantially the same length may be formed. FIG. 24 is an example of an electronic device housing. As illustrated in FIG. 24, regarding the ducts 166, ducts 166 having different lengths may be directly coupled to the rear surface portion of the body portion 162. In such a case, the space 172 with a certain width that passes the external air may be configured between the body portion 162 and one of the ducts 166.

Figure 25:
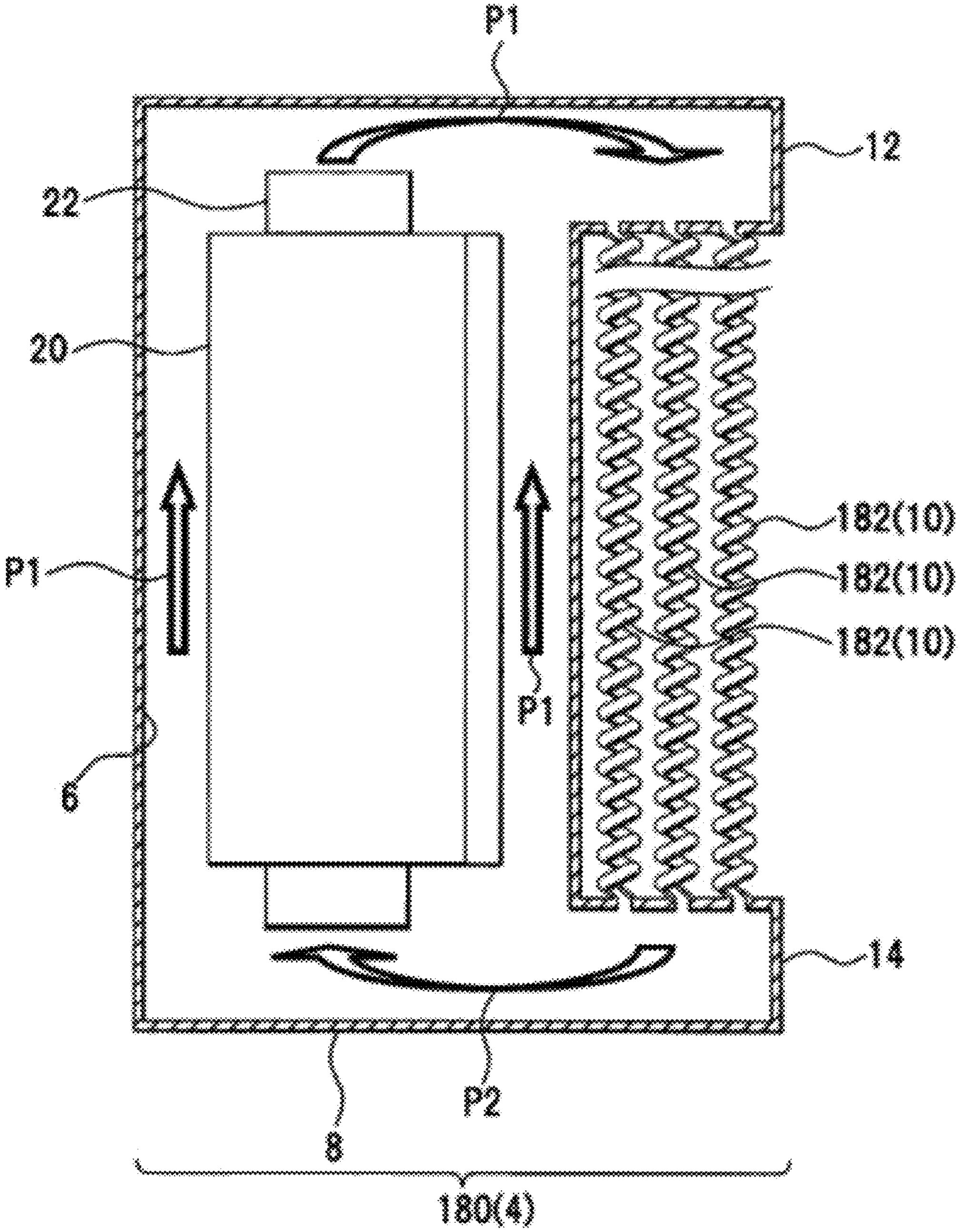
FIG. 25 illustrates an example of an electronic device housing.

A straight pipe in which the inner flow path of each duct 10, which exchanges heat with the external air by making the air inside the case flow therein, is formed in a linear shape may be formed. FIG. 25 illustrates an example of an electronic device housing. As illustrated in FIG. 25, an electronic device 180 may employ ducts 182 that have helical flow paths, for example. In the ducts 182, for example, by flowing air through the helical flow paths across a distance in the up-down direction of the ducts 182, the flowing paths are set long and, further, the air is made to flow inside the helical portion as well performing heat exchange; accordingly, the contact area with the external air is set large. Accordingly, the function of cooling the air inside the case with the ducts 182 may be enhanced.

Figure 26:
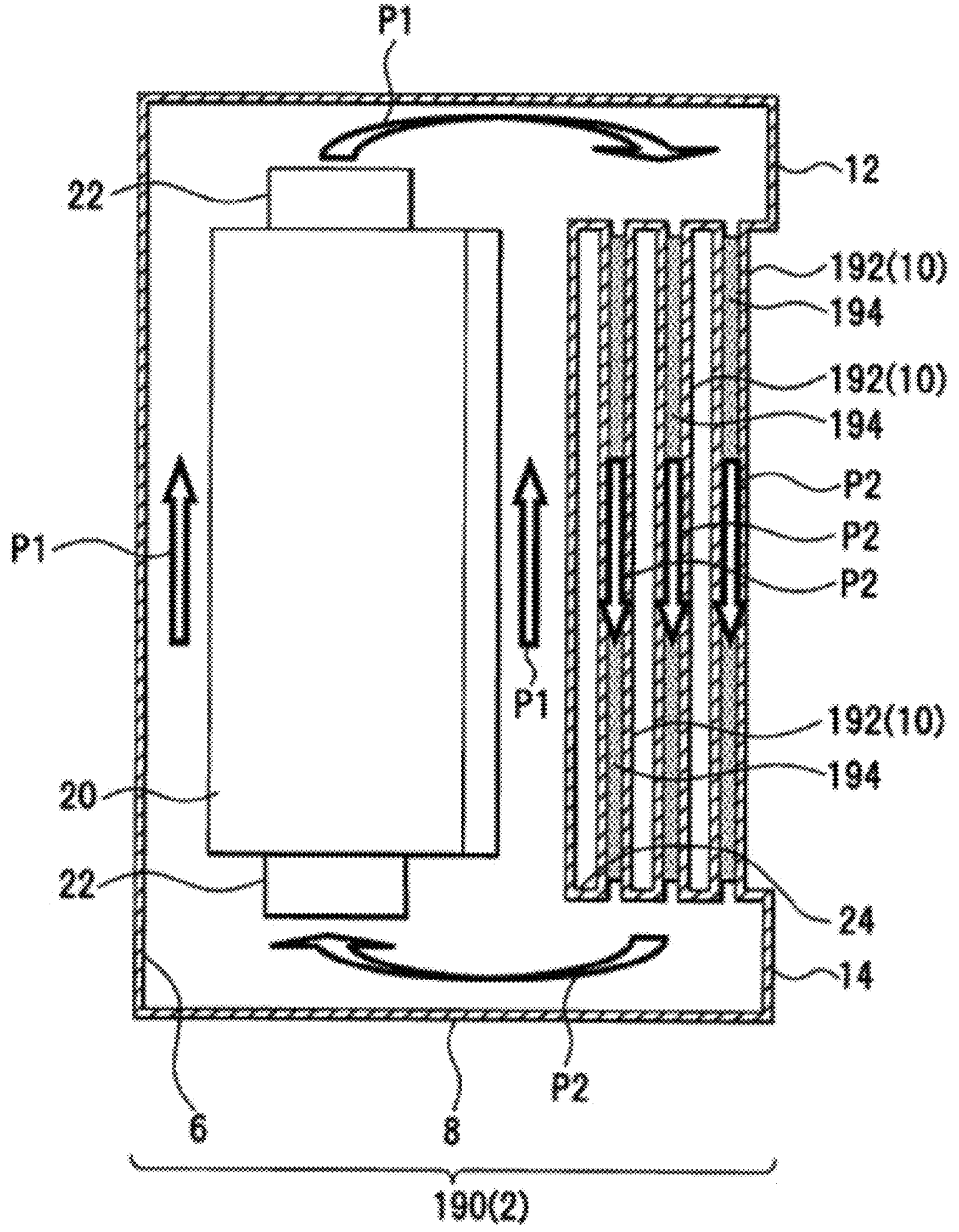
FIG. 26 illustrates an example of an electronic device housing.

FIG. 26 is an example of an electronic device housing. As illustrated in FIG. 26, in an electronic device housing 190, form aluminum 194 may be filled inside the ducts 192 serving as a member improving the heat absorbing effect. The form aluminum 194 includes a plurality of minute pores and may be an example of the heat absorbing member that is capable of having air flow therein. With the high thermal conductivity, the efficiency of heat exchange with the external air through the ducts 192 may be increased.

In the ducts 192, for example, the form aluminum 194 is filled into a specific distance or all of the body portion, and by having heated air P1 pass through the inside of the form aluminum 194, radiation of heat to the external air is performed.

Figure 27:
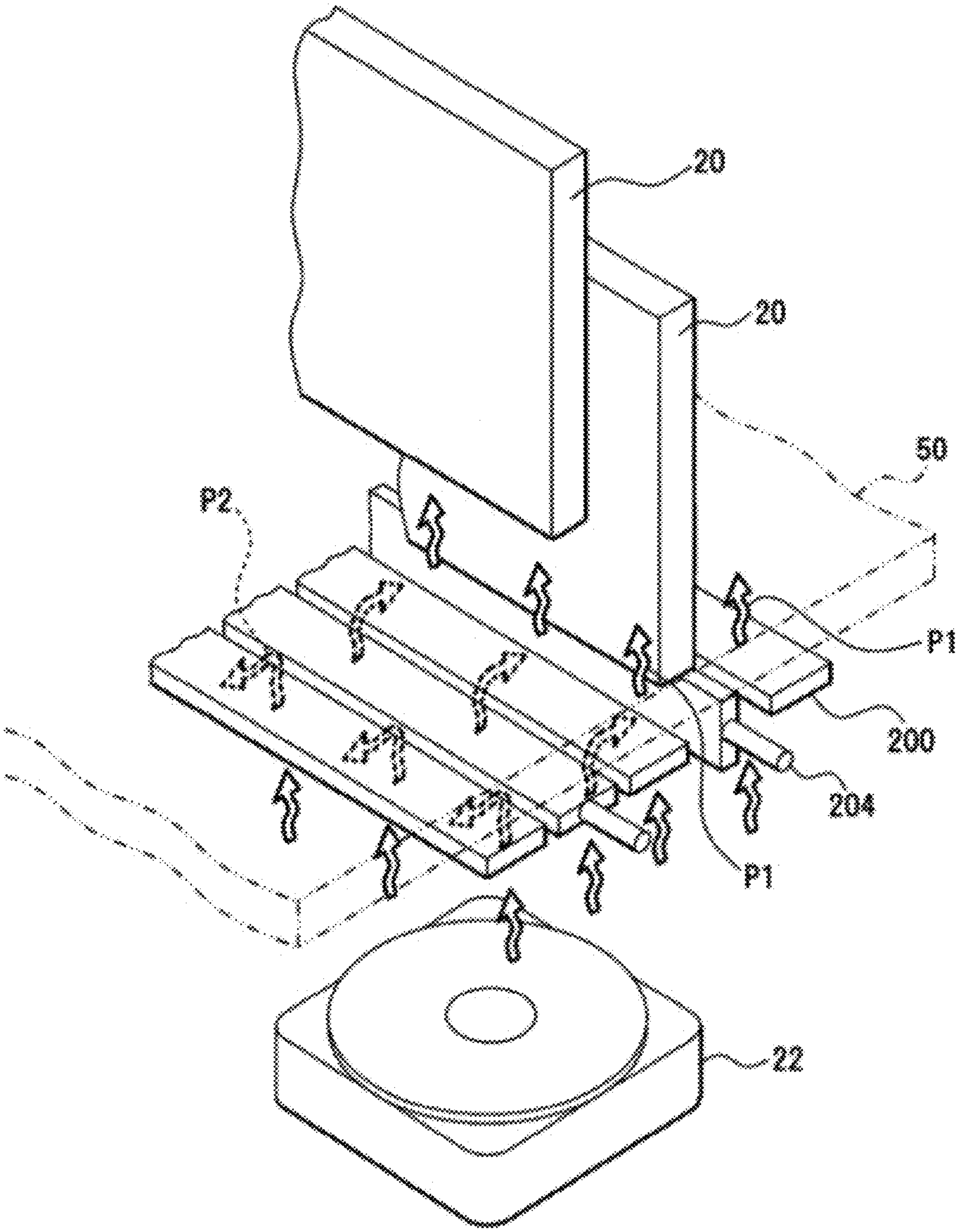
FIG. 27 illustrates an example of an electronic device housing.

In the housing 2 and the device case 32, for example, in order to stabilize the air flowing state inside the housing portion 6, 35, the air flowing state may be controlled in accordance with the arrangements the of the electronic component 20 inside the housing portion 6, 35. FIG. 27 illustrates an example of an electronic device housing. As illustrated in FIG. 27, for example, opening and closing plates 200 may be included in the housing portion 6 as a portion of the shelf 50 or separately from the shelf 50. The opening and closing plates 200 may each be an example of a component of a flow rate control member and the opening and closing position may be set based on the arrangement of the electronic component 20 with respect to the BWB 54 or the shelf 50. In the opening and closing plate 200, for example, support shafts 204 that switch between the "open" states and the "closed" states of the opening and closing plates 200 that rotate in an interlocked manner with the attachment and detachment of the electronic component 20 with respect to the shelf 50 are disposed.

When the electronic component 20 is mounted on the shelf 50, by being interlocked with detecting the mounted state of the electronic component 20 by a detection device, the opening and closing plates 200 are switched to the "open" states by the rotation of the support shafts 204. The detection device detects electrical or physical approach or contact of the electronic component 20 to the shelf 50 or the BMB 54, for example. For example, the support shaft 204 may be operated upon contact of the electronic component 20 to the detection device, or a motive power such as a motor may be provided separately and the opening and closing operation may be performed through control of a control circuit.

When a full set of the electronic components 20 that is to be housed in the housing portion 6, 35 is not mounted on the BWB 54, ventilation of the shelf 50 where the electronic component 20 is not mounted may be reduced with such opening and closing plates 200, for example. Accordingly, a state in which a large amount of air cooled by the duct 36 flows into a portion where the electronic component 20 is not installed and air flowing into a portion where the electronic components 20 are densely mounted is reduced may be created less frequently.

Since air is made to flow efficiently in a portion where the heat generating components are densely mounted in the housing portion 6, 35, the cooling function of the electronic device housing may be enhanced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device housing, comprising:

a housing case including a housing area which houses a heat generating component;

a duct, including ends which are in communication with the housing area at different positions and a body portion disposed outside the housing area, in which first air inside the housing case which is heated by the heat generating component flows; and a flow device, disposed in the housing case, configured to circulate the first air and make second air which radiates heat in the duct flow towards a side of the housing area side, wherein the housing case includes a first connection portion which protrudes from the housing case and is coupled to the duct at one of the different positions and a second connection portion which protrudes from the housing case and is coupled to the duct at the other of the different positions, wherein a ventilation path, surrounded by the body portion, the housing case, the first connection portion and the second connection portion, is configured to pass outside air.

2. The electronic device housing according to claim 1, wherein the housing area and the duct is coupled in a sealed state.

3. The electronic device housing according to claim 1, further comprising, an air directing member configured to direct a flow direction of the first air towards a side of the first connection portion.

4. The electronic device housing according to claim 1, wherein the duct is in communication with the housing area through inner portions of the first connection portion and the second connection portion.

5. The electronic device housing according to claim 4, wherein at least one of protruding amounts or inner volumes of the first connection portion and the second connection portion is set in accordance with a flow rate of third air that includes the first air and the second air and is circulated between the housing area and the duct.

6. The electronic device housing according to claim 4, wherein each of the first connection portion and the second connection portion includes a contact wall configured to change a flowing direction of third air that includes the first air and the second air and is circulated between the housing area and the duct and make the third air flow in a given direction.

7. The electronic device housing according to claim 4, wherein the first connection portion and the second connection portion are coupled to the duct through a fixing member or an adhesion mechanism.

8. The electronic device housing according to claim 1, wherein the duct includes a plurality of flow paths disposed in a parallel.

9. The electronic device housing according to claim 8, wherein the plurality of flow paths are disposed in a parallel manner at an interval that is set based on a heat radiation capacity.

10. The electronic device housing according to claim 1, further comprising, a heat radiation component disposed on an exterior side of the duct.

11. The electronic device housing according to claim 1, wherein a heat absorbing member is filled inside the duct.

12. The electronic device housing according to claim 1, further comprising, an air guiding member configured to make outside air flow towards the duct.

13. The electronic device housing according to claim 1, further comprising, a flow rate control member including an opening and closing plate configured to open and close in accordance with attachment and detachment of the heat generating component.

14. An electronic device housing, comprising:

a housing case including a housing area which houses a heat generating component; and a duct, including ends which are in communication with the housing area at different positions respectively, a body portion disposed outside the housing area and a plurality of flow paths, in which air inside housing case which is heated by the heat generating component flows through the plurality of flow paths, wherein the housing case includes a first connection portion which protrudes from the housing case and is coupled to the duct at one of the different positions and a second connection portion which protrudes from the housing case and is coupled to the duct at the other of the different positions, wherein a ventilation path, surrounded by the body portion, the housing case, the first connection portion and the second connection portion, is configured to pass outside air.

15. An electronic device, comprising:

a heat generating component configured to generate heat;

a housing case including a housing area which houses the heat generating component;

a duct, including ends which are in communication with the housing area at different positions respectively and a body portion disposed outside the housing area, in which first air inside the housing case which is heated by the heat generating component flows; and a flow device configured to make the first air flow in a preset direction, wherein the housing case includes a first connection portion which protrudes from the housing case and is coupled to the duct at one of the different positions and a second connection portion which protrudes from the housing case and is coupled to the duct at the other of the different positions, wherein a ventilation path, surrounded by the body portion, the housing case, the first connection portion and the second connection portion, is configured to pass outside air.

16. The electronic device according to claim 15, wherein second air which radiates heat in the duct flows towards a side of the housing area side by a circulation of the first air performed by the flow device.

17. The electronic device according to claim 15, further comprising a controller configured to control a circulation flow rate of third air inside the housing case including the first air in accordance with at least one of a heat quantity of the heat generating component and a preset radiation amount of the duct.

* * * * *